United States Patent
Reznicek et al.

(10) Patent No.: US 11,695,004 B2
(45) Date of Patent: Jul. 4, 2023

(54) VERTICAL BIPOLAR JUNCTION TRANSISTOR AND VERTICAL FIELD EFFECT TRANSISTOR WITH SHARED FLOATING REGION

(71) Applicant: International Business Machines Corporation, Armonk, NY (US)

(72) Inventors: Alexander Reznicek, Troy, NY (US); Ruilong Xie, Niskayuna, NY (US); Jeng-Bang Yau, Yorktown Heights, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/506,913

(22) Filed: Oct. 21, 2021

(65) Prior Publication Data

US 2023/0126578 A1    Apr. 27, 2023

(51) Int. Cl.
| | |
|---|---|
| H01L 27/06 | (2006.01) |
| H01L 21/8249 | (2006.01) |
| H01L 27/082 | (2006.01) |
| H01L 29/66 | (2006.01) |
| H01L 29/78 | (2006.01) |
| H01L 29/732 | (2006.01) |

(52) U.S. Cl.
CPC ...... H01L 27/0623 (2013.01); H01L 21/8249 (2013.01); H01L 27/0617 (2013.01); H01L 27/0826 (2013.01); H01L 29/66666 (2013.01); H01L 29/732 (2013.01); H01L 29/7827 (2013.01)

(58) Field of Classification Search
CPC ............ H01L 27/0623; H01L 21/8248; H01L 21/8249; H01L 27/0617; H01L 29/66666; H01L 29/7827; H01L 29/66272; H01L 29/732; H01L 29/0821; H01L 21/823487; H01L 21/823885; H01L 21/823437; H01L 27/0826; H01L 27/0922
See application file for complete search history.

(56) References Cited

U.S. PATENT DOCUMENTS

| | | | |
|---|---|---|---|
| 5,068,705 A * | 11/1991 | Tran | H01L 27/0623 257/E27.012 |
| 5,367,184 A * | 11/1994 | Chantre | H01L 29/66242 257/E29.189 |
| 5,641,691 A | 6/1997 | Cartagena | |
| 8,093,661 B2 | 1/2012 | Lung | |
| 9,263,583 B2 * | 2/2016 | Cai | H01L 21/845 |

(Continued)

OTHER PUBLICATIONS

"Integrated vertical BJT compatible with Nanosheet process," Disclosed Anonymously, IPCOM000256764D, Dec. 28, 2018.

*Primary Examiner* — Shouxiang Hu
(74) *Attorney, Agent, or Firm* — Matthew Zehrer

(57) ABSTRACT

A semiconductor device or circuit includes a vertical bipolar junction transistor (vBJT) and a vertical filed effect transistor (vFET). The vBJT collector is electrically and/or physically connected to an adjacent vFET source. For example, a vBJT collector and a vFET source may be integrated upon a same semiconductor material substrate or layer. The vFET provides negative feedback for the collector-base voltage and the vBJT emitter and collector allow for low transit times.

19 Claims, 19 Drawing Sheets

(56) References Cited

U.S. PATENT DOCUMENTS

| | | |
|---|---|---|
| 9,331,097 B2 | 5/2016 | Cai |
| 10,002,797 B1 | 6/2018 | Pandey |
| 10,170,463 B2 | 1/2019 | Anderson |
| 10,541,329 B2 | 1/2020 | Ok |
| 2019/0198648 A1 | 6/2019 | Kang |
| 2019/0267376 A1 | 8/2019 | Chiang |

* cited by examiner

VERTICAL BIPOLAR JUNCTION TRANSISTOR AND VERTICAL FIELD EFFECT TRANSISTOR WITH SHARED FLOATING REGION

BACKGROUND

Various embodiments of the present application generally relate semiconductor device fabrication methods and resulting structures. More specifically the various embodiments relate to a vertically orientated bipolar junction transistor (BJT) and vertically orientated field effect transistor (FET) with a shared floating region.

SUMMARY

In an embodiment of the present invention, a semiconductor device is presented. The semiconductor device includes a BJT and FET. The BJT includes a collector region, an emitter region vertically above the collector region, and an inner base region positioned between the emitter region and the collector region. The base region controls charge flow from the emitter region to the collector region. The FET includes a source region electrically connected to the collector region such that all current passing the collector region enters the source region, a drain region vertically above the source region, a channel region positioned between the drain region and the source region, and a gate region physically connected to a sidewall of the channel region.

In another embodiment of the present invention, a four-terminal transistor device is presented. The four-terminal transistor device includes a BJT and a FET. The BJT includes a collector region, an emitter region vertically above the collector region and electrically connected to a first terminal, and an inner base region positioned between the emitter region and the collector region. The base region controls charge flow from the emitter region to the collector region. The base region is also electrically connected to a second terminal. The FET includes a source region electrically connected to the collector region such that all current passing the collector region enters the source region, a drain region vertically above the source region and electrically connected to a third terminal, a channel region positioned between the drain region and the source region, and a gate region physically connected to a sidewall of the channel region and electrically connected to a fourth terminal.

In another embodiment of the present invention, a semiconductor device fabrication method is presented. The method includes forming an inner base opening and a channel opening, forming an inner base region within the inner base opening and forming a channel region within the channel opening, patterning a sacrificial layer to define a sacrificial base and a sacrificial gate, forming a base trench to expose a portion of the sacrificial base, removing the sacrificial base through the base trench and forming an outer base region in place thereof, forming an emitter opening upon the inner base region and forming a drain opening upon the channel, forming a emitter region within the emitter opening and forming a drain region within the drain opening, forming a gate trench to expose a portion of the sacrificial gate, and removing the sacrificial gate through the gate trench and forming a gate region in place thereof.

These and other embodiments, features, aspects, and advantages will become better understood with reference to the following description, appended claims, and accompanying drawings.

DETAILED DESCRIPTION

Figure 1:
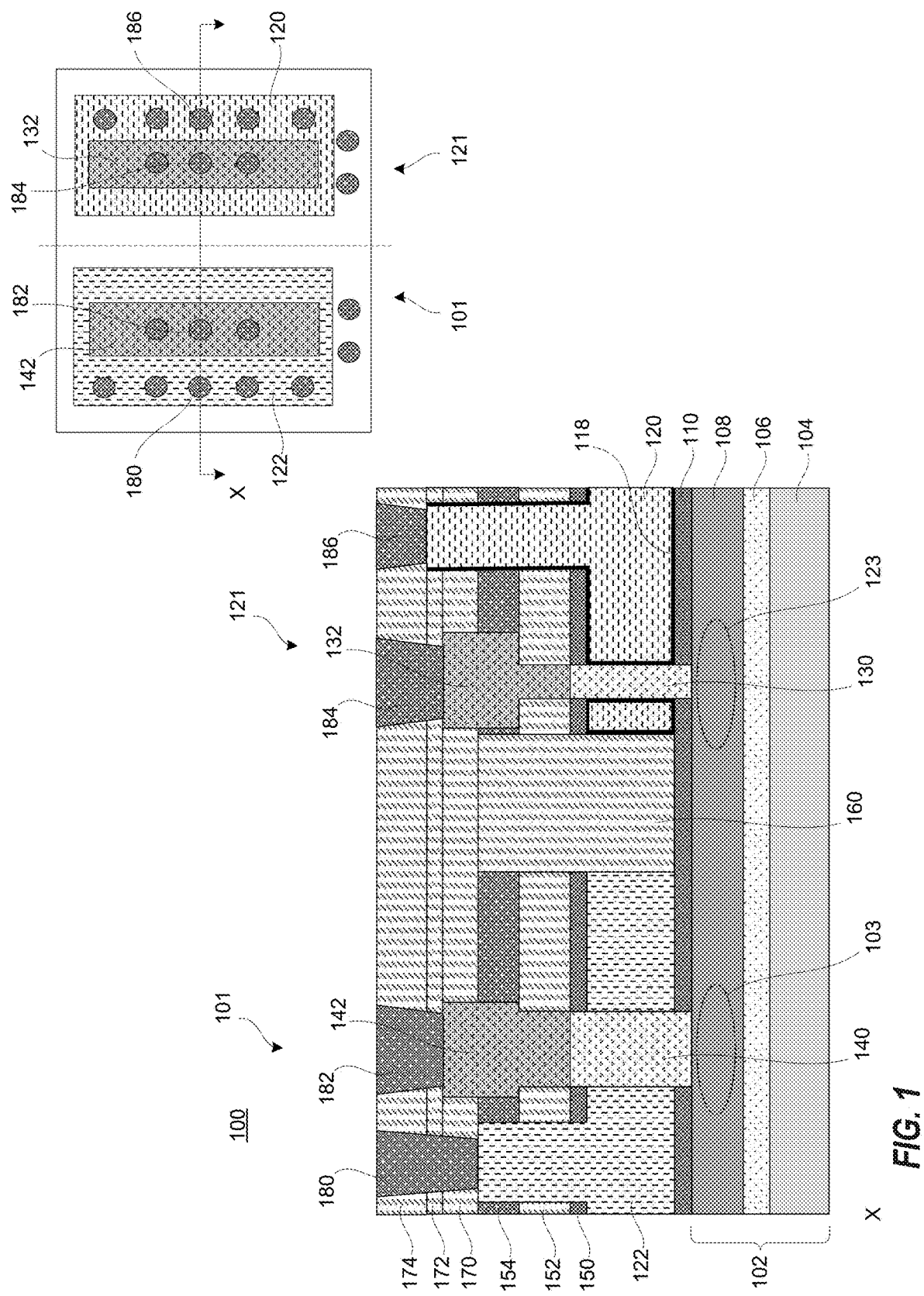
FIG. 1 through FIG. 17 depict cross-sectional views of a semiconductor device shown after respective fabrication operations, in accordance with one or more embodiments.

It is understood in advance that although a detailed description is provided herein of an exemplary BJT and FET architecture that includes a vertical BJT and a vertical FET, with a collector of the BJT electrically connected to a source of the FET, that can achieve a high-speed BJT with minimized avalanche breakdown. Implementation of the teachings recited herein are not limited to the particular BJT and FET architecture described herein. Rather, embodiments of the present invention are capable of being implemented in conjunction with any other appropriate type of BJT and FET device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and integrated circuit (IC) device fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, a FET is a semiconductor device commonly found in a wide variety of ICs. A FET is essentially a switch. When a voltage is applied to a gate of the FET that is greater than a threshold voltage, the switch is turned on, and electron carriers flow through the FET channel from the source to the drain. When the voltage at the gate is less than the threshold voltage, the switch is off, and electron carriers do not flow through the transistor.

BJT are transistors commonly utilized as amplifiers, switches, and oscillators. The operation of BJTs relies on charge carrier movement from an emitter region to a collector region via a base region. The emitter regions are commonly doped with a first conductivity type, and the base region doped with a second conductivity type. For a BJT where the first conductivity type is n-type and the second conductivity type is p-type, during operation, the emitter region is forward biased to drive electron carriers from the n-type emitter through the p-type base region to the collector region, while the collector region is reverse biased to prevent electron carriers from travelling from the collector region to the base region.

In a semiconductor, electron carriers (negative charge carriers) move about in the conduction band and hole carriers (positive charge carriers) move about in the valence band. In the space-charge region of a p-n junction, for example the space-charge region of base-collector junction of a BJT, there is an electric field due to the voltage differential between the p-type region and the n-type region of the p-n junction. The larger the voltage differential, the larger the electric field. When electron and hole carriers move about in a space-charge region with electric field, they can gain enough energy from the electric field to dislodge fixed electrons (non-carrier electrons), lifting them from the valence band to the conduction band. Once lifted from the valence band to the conduction band, the dislodged electrons are electron carriers and are free to move about in the conduction band. For each electron thus lifted from the valence band to the conduction band, a hole carrier is created in the valence band. The hole carriers thus created are free to move about in the valence band. The process in which a high-energy electron or hole carrier dislodges a fixed electron to create an electron carrier in the conduction band and a hole carrier in the valence band is known as impact ionization. At high enough voltage between the p-type region and the n-type region, the electron and hole carriers created in the impact ionization process can themselves undergo impact ionization processes and create more electron and hole carriers. At still higher voltage between the p-type region and the n-type region, the cascading impact ionization processes multiply into what is commonly known as avalanche breakdown.

For certain applications, such as power and motor switches, BJTs often require relatively high voltages across the emitter and collector regions. The voltage across the emitter and collector regions at which avalanche breakdown occurs in the base-collector junction is the collector to emitter breakdown voltage (BVCEO). For reliable operation, the voltage across the emitter and collector regions must be less than the breakdown voltage BVCEO of the BJT.

In order to address avalanche breakdown in such bipolar junction transistor applications, a common approach is to lightly dope the collector region. For a given voltage across a p-n junction, the electric field is smaller when the dopant concentration of the p-type region, the n-type region, or both the p-type and n-type regions, is reduced. Thus, a BJT having a lightly doped collector region has a larger collector emitter breakdown voltage than a BJT having a more heavily doped collector region. However, a lightly doped collector region also means low charge carrier density in the collector region, and hence low current carrying capability for the BJT.

In the operation of a BJT, charge carriers are injected from the emitter region into the base region. As these charge carriers traverse the base region and reach the collector region, they become the charge carriers in the collector region. A BJT operated to carry a large current implies a large density of charge carriers injected from the emitter region and reaching the collector region. When the density of charge carriers in the collector, injected from the emitter, is larger than the dopant density of the collector region, there is a corresponding rise in the density of charge carriers of the opposite polarity in the collector in order to maintain local charge neutrality in the collector region. Charge neutrality means there is no net charge, positive or negative, present in the region. In other words, when the density of charge carriers in the collector, injected from the emitter, is larger than the dopant density of the collector region, the BJT behaves as if a corresponding amount of charge carriers of the opposite polarity from the base are pushed into, and accumulate in, the collector region. This phenomenon, commonly referred to as the Kirk Effect or base pushout, increases transit times (particularly on-to-off-time). Therefore, in conventional BJT design, there is a design conflict between large current carrying capability which requires high collector dopant density, and large collector-emitter breakdown voltage which requires low collector dopant density. As such, the conventional BJT is simply inferior for high speed, high voltage applications, such as power and motor switches.

Some known BJT architectures attempt to address such weaknesses in high speed applications, by addressing the issue of avalanche breakdown across the emitter and collector regions by connecting the collector terminal to the source terminal of an adjacent and laterally or horizontally aligned FET. These architectures typically rely upon a planar structure that requires an SOI substrate for adequate isolation, which implies higher cost and has limited device density.

According to the various embodiments, the BJT and FET architecture addresses such deficiencies while allowing for a vertically aligned BJT and vertically aligned FET to be formed upon a bulk substrate (i.e., lower cost) while also allowing for increased higher density, due to the vertical orientation of the BJT and FET. The term vertically orientated BJT is defined herein as a BJT with a BJT emitter and associated BJT collector arranged vertically. Similarly, the term vertically orientated FET is defined herein as a FET with a FET source and associated FET drain arranged vertically. The described BJT and FET architecture can further achieve potentially higher output current for high power or high performance applications by engineering or varying the depths of BJT and VFET (collectively or separately) without increasing the surface area of the IC device.

An aspect of the invention is a vertical BJT and vertical FET that includes the BJT collector electrically connected to an adjacent FET source. For example, the BJT and FET include a shared BJT collector and FET source. Thus, the FET provides negative feedback for the collector-base voltage, while a potential symmetrically doped (i.e., same dopant concentrations) emitter and collector allow for low transit times.

Figure 2:
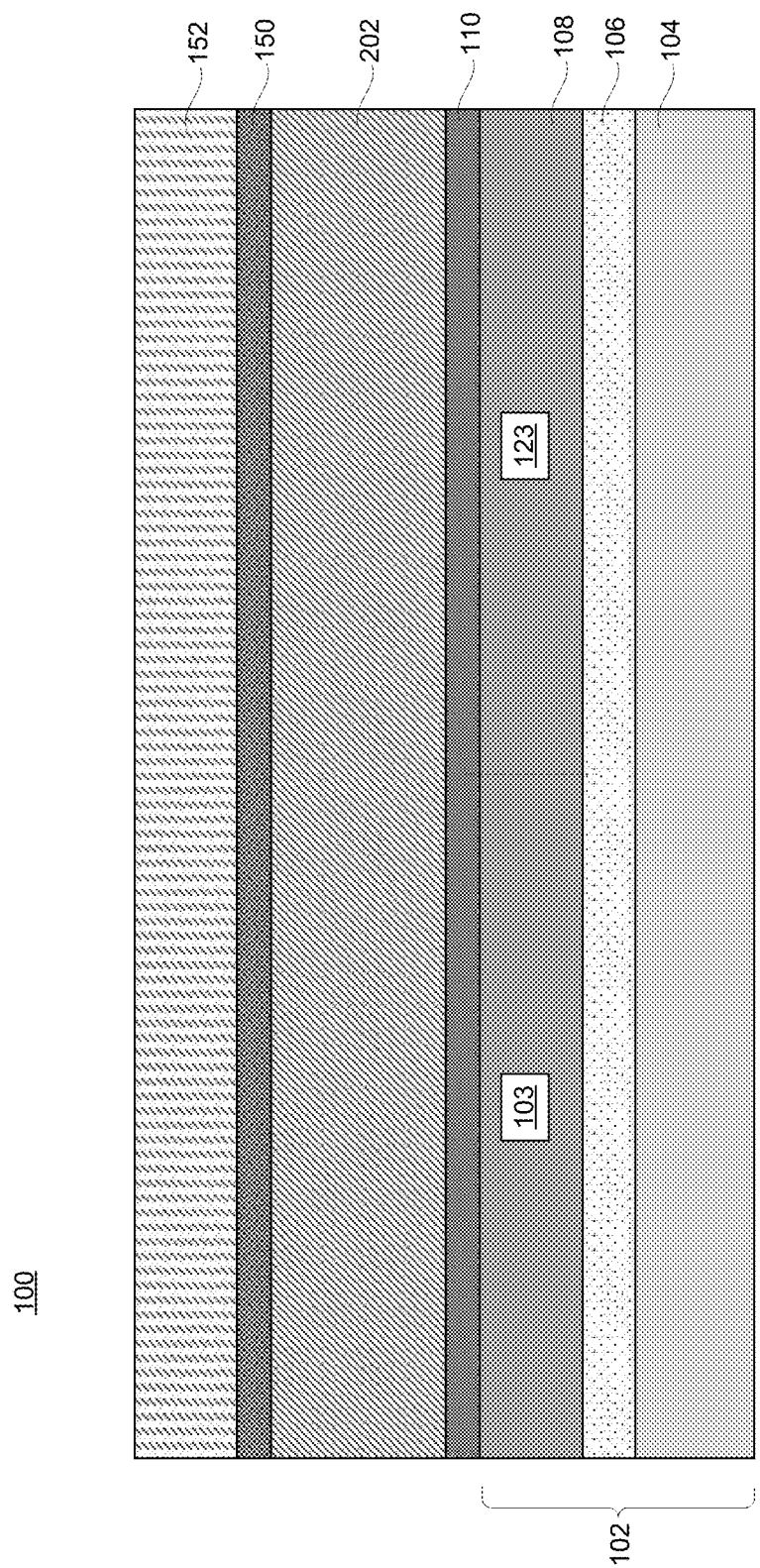

FIG. 1 depicts a cross-sectional view of a semiconductor device 100 shown after fabrication operations, in accordance with one or more embodiments. Semiconductor device 100 is depicted in FIG. 2 though FIG. 17 at various fabrication stages. The cross-section views of the depicted semiconductor device 100 structures depicted in FIG. 2 through FIG. 17 are defined by the cross-sectional plane defined in an exemplary partial top view of semiconductor device 100 shown in FIG. 1, and is used throughout the remaining structural drawings.

Figure 19:
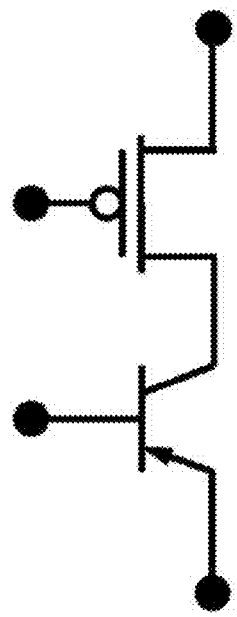
FIG. 19 is a circuit diagram of a semiconductor device that includes a BJT in a PNP configuration and a FET in a pFET configuration.
Figure 20:
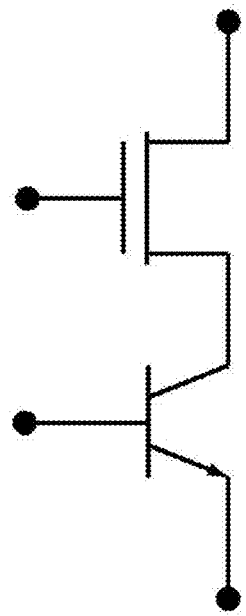
FIG. 20 is a circuit diagram of a semiconductor device that includes a BJT in a NPN configuration and a FET in a nFET configuration.

The semiconductor device 100 includes a substrate 102, a BJT 101, and a FET 121. In an embodiment, which may be referred to as the PNP embodiment, the BJT 101 consists of a PNP configuration, and the FET 121 consists of a pFET configuration. FIG. 19 is a circuit diagram of the semiconductor device 100 with the BJT 101 int the PNP configuration and the FET 121 in the pFET configuration. Alternatively, the BJT 101 may consist of a NPN configuration and the FET 121 consists of a nFET configuration. FIG. 20 is a circuit diagram of the semiconductor device 100 with the BJT 101 in the NPN configuration and the FET 121 in the nFET configuration.

Referring to FIG. 1, BJT 101 includes collector region 103, outer base region 122, inner base region 140, and a emitter region 142, such that the emitter region 142 is vertically orientated or positioned on top of or vertically above the collector region 103. Here, the BJT 101 may be referred to as a vertically orientated bipolar junction transistor, wherein at least the collector region 103, inner base region 140, and emitter region 142 are vertically aligned. Charge carriers from the emitter region 142 flow vertically via at least the inner base region 140 to the collector region 103, with the inner base region 140 and the outer base region 122 collectively controlling charge flow from the emitter region 142 to the collector region 103.

The collector region 103 and emitter region 142 both include dopants of a first conductivity type, and the outer base region 122 and inner base region 140 includes dopants of a second conductivity type. In the embodiment show in FIG. 1, the BJT 101 is configured in the PNP configuration, such that the collector region 103 and emitter region 142 consist of P-type doped semiconductor materials (first conductivity type), and the outer base region 122 and inner base region 140 consists of N-type doped semiconductor materials (second conductivity type). The BJT 101 may be configured as a symmetrical BJT, such that the collector region 103 and emitter region 142 are doped with substantially the same dopant concentration. The symmetrical doping reduces the BJT's 101 susceptibility to base pushout and switching speed degradation.

The semiconductor device 100 also includes a FET 121. The FET 121 includes source region 123, gate region 120, channel region 130, and drain region 132, such that the drain region 132 is vertically orientated or positioned on top of or vertically above the source region 123.

As depicted, the collector region 103 and the source region 123 are physically continuous as a single layer. However, it should be noted that in some embodiments, the collector region 103 and the source region 123 may be physically separate but electrically connected. In such embodiments, the collector region 103 and the source region 123 may share the same substrate layer, may be positioned on a different substrate, may be positioned on a different substrate layer, etc. As the collector region 103 and the source region 123 are at least electrically coupled, current passes from the collector region 103 to the source region 123. The collector region 103 and source region 123 form a floating region with effectively no leakage current. As such, the semiconductor device 100 may operate as a single transistor.

Referring to FIG. 1, the source region 123 and collector region 103 are a physically continuous region as a single layer. The flow of charge carriers from the source region 123 to the drain region 132 is controlled by the voltage across the channel region 130. The source region 123 and drain region 132 may include dopants of the first conductivity type. The gate region 120 may include an electrically conducting material and an electrically insulating material. In this embodiment, the FET 121 is configured as an pFET, such that the source region 123 and drain region 132 consist of P-type doped semiconductor materials.

Referring to FIG. 19, which depicts a circuit diagram of the semiconductor device 100 with BJT 101 int the PNP configuration and the FET 121 in the pFET configuration. The circuit diagram depicts collector region 103 of BJT 101 electrically coupled with the source region 123 of FET 121 via the floating region. The floating region effectively has no leakage current, such that the current at the collector region 103 is equal to the current through the field effect transistor 121. Consequently, the source region 123 of the FET 121 effectively acts as the collector terminal for the BJT 101. The voltage across the drain region 132 and gate region 120 of the FET 121 acts as a negative feedback component, reducing the voltage across the outer base region 122/inner base region 140 and the collector region 103. Thus, the BVCEO can be effectively increased, while maintaining minimum transit times during switching.

The BJT 101 may alternatively consist in the NPN configuration and may be paired with a FET 121 in the nFET configuration. FIG. 20 is a circuit diagram of such configuration. The circuit diagram depicts the BJT 101 and the FET 121 electrically coupled via the floating region. As indicated above, the floating region effectively has no leakage current, such that the current at the collector region 103 is equal to the current through the field effect transistor 121. Consequently, the source region 123 of the FET 121 effectively acts as a collector terminal for the BJT 101, the voltage across the source region 123 and gate region 120 of the FET 121 acts as a negative feedback component, etc. Thus, BVCEO can be effectively increased, while maintaining minimum transit times during switching.

In these embodiments, the electrical circuit semiconductor device 100 may be a four terminal switch. As such, the gate region 120 of the FET 121 may be biased separately from the BJT 101. Additionally, the BJT 101 may be switched on and off independent of the FET 121, as the outer base region 122/inner base region 140 is not affected by the capacitance load of the FET 121.

Referring to FIG. 1, for clarity, semiconductor device 100 includes gate region 120 and outer base region 122. Gate region 120 and outer base region 122 may respectively include a substantially horizontal portion (i.e., width greater than height) and a substantially vertical potion (i.e., height greater than width). As such, gate region 120 and outer base region 122 may have a general "L" shape, backward "L" shape, upside down "T" shape, or the like. The substantially vertical portion includes a top surface and the substantially horizonal portion also includes a top surface. In embodiments, as depicted, the top surface of the substantially vertical portion of gate region 120 and outer base region 122 may be above the top surface of the substantially horizontal portion of gate region 120 and outer base region 122, respectively. The top surface of the substantially vertical portions of gate region 120 and outer base region 122 may be substantially coplanar or may be offset (as depicted).

Referring to FIG. 1, the substantially vertical portions of gate region 120 and outer base region 122, respectively, may be located outside of the emitter region 142 and may be outside drain region 132. Alternatively, the substantially vertical portion of gate region 120 and outer base region 122, respectively, may be located inside of the emitter region 142 and may be located inside drain region 132. Alternatively, the substantially vertical portion of gate region 120 and outer base region 122, respectively, may be located to the right of or left of each of the of the emitter region 142 and the drain region 132.

Referring to FIG. 1, inner base region 140 may have a substantially similar top view shape as, e.g., emitter region 142. Similarly, channel region 130 may have a substantially similar top view shape as, e.g., drain region 132.

Semiconductor structure 100 can further achieve potentially higher output current for high power or high-performance applications by engineering or varying the depths of BJT and VFET (collectively or separately). For example, a relatively shorter or thinner base region 122 and/or inner base region 140 may achieve faster BJT 101 speeds, which translates to equivalently higher output current or power utilizing the same voltage driver. Similar speed improvements may also be implemented by similar geometry modifications to e.g., channel region 130 in FET 121.

FIG. 2 depicts a cross-sectional view of a semiconductor device 100 shown in an exemplary initial fabrication operation, in accordance with one or more embodiments. At the present fabrication stage, semiconductor device 100 may include a substrate 102, a bottom spacer 110, a sacrificial layer 202, a top spacer 150, and a interlayer dielectric (ILD) 152.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk semiconductor material. Alternatively, as depicted, the substrate 102 may be substrate on insulator (e.g., silicon on insulator (SOI), or the like) that may include a substrate 104, an insulator 106 upon the substrate 104, and a semiconductor layer 108 upon the insulator 106. The materials of the substrate 104 and the semiconductor layer 108 may be the same as those materials listed for substrate 102. Insulator 106 may be known SOI insulator or isolator materials.

Substrate 102 and/or semiconductor layer 108 includes collector region 103 and includes source region 123. Where BJT 101 is in the PNP configuration and where FET 121 is in the pFET configuration, substrate 102 and/or semiconductor layer 108 includes P-type dopants, such as Boron, BF2, with concentration of, for example, $1 \times 10^{19}$ atoms/cm$^3$ to $5 \times 10^{21}$ atoms/cm$^3$. Alternatively, where BJT 101 is in the NPN configuration and where FET 121 is in the nFET configuration, substrate 102 and/or semiconductor layer 108 includes N-type dopants, such as Phosphorus, Arsenic, Antimony, or the like, with a concentration of, for example, $1 \times 10^{19}$ atoms/cm$^3$ to $5 \times 10^{21}$ atoms/cm$^3$.

Bottom spacer 110 may be formed of SiN, or the like, upon the substrate 102 and/or semiconductor layer 108. Bottom spacer 110' may be formed by depositing the bottom spacer 110 material by, for example, PVD, CVD, ALD, or the like. Bottom spacer 110 can have a thickness of from about 4 nm to about 20 nm, although other thicknesses are within the contemplated scope. In implementations, bottom spacer 110 may at least partially physically and/or electrically separate, isolate, gate region 120 from source region 123.

Sacrificial layer 202 may be formed of amorphous Si (aSi), amorphous SiGe (aSiGe), amorphous Ge (aGe), etc. or the like, upon bottom spacer 110'. Sacrificial layer 202 may be formed by depositing the sacrificial layer 202 material by, for example, PVD, CVD, ALD, or the like. Sacrificial layer 202 can have a thickness of from about 12 nm to about 50 nm, although other thicknesses are within the contemplated scope. In embodiments, as further described, a portion of the sacrificial layer 202 may at least partially define, define, or the like, the base region within BJT 101 and another portion of the sacrificial layer 202 may at least partially define, define, or the like, the gate region within FET 121.

Top spacer 150 may be formed of SiN, SiN, SiBCN, SiOCN, SiOC, or the like, upon the sacrificial layer 202. Top spacer 150 may be formed by depositing the top spacer 150 material by, for example, PVD, CVD, ALD, or the like. Top spacer 150 can have a thickness of from about 4 nm to about 20 nm, although other thicknesses are within the contemplated scope. In implementations, top spacer 110 may at least partially physically and/or electrically separate, isolate, gate region 120 from drain region 132.

ILD 152 may be formed of a known dielectric material, such as $SiO_2$, SiN, a combination, or the like, upon the top spacer 150. ILD 152 may be formed by depositing the ILD 152 material by, for example, PVD, CVD, ALD, or the like. ILD 152 can have a thickness of from about 5 nm to about 50 nm, although other thicknesses are within the contemplated scope.

Figure 3:
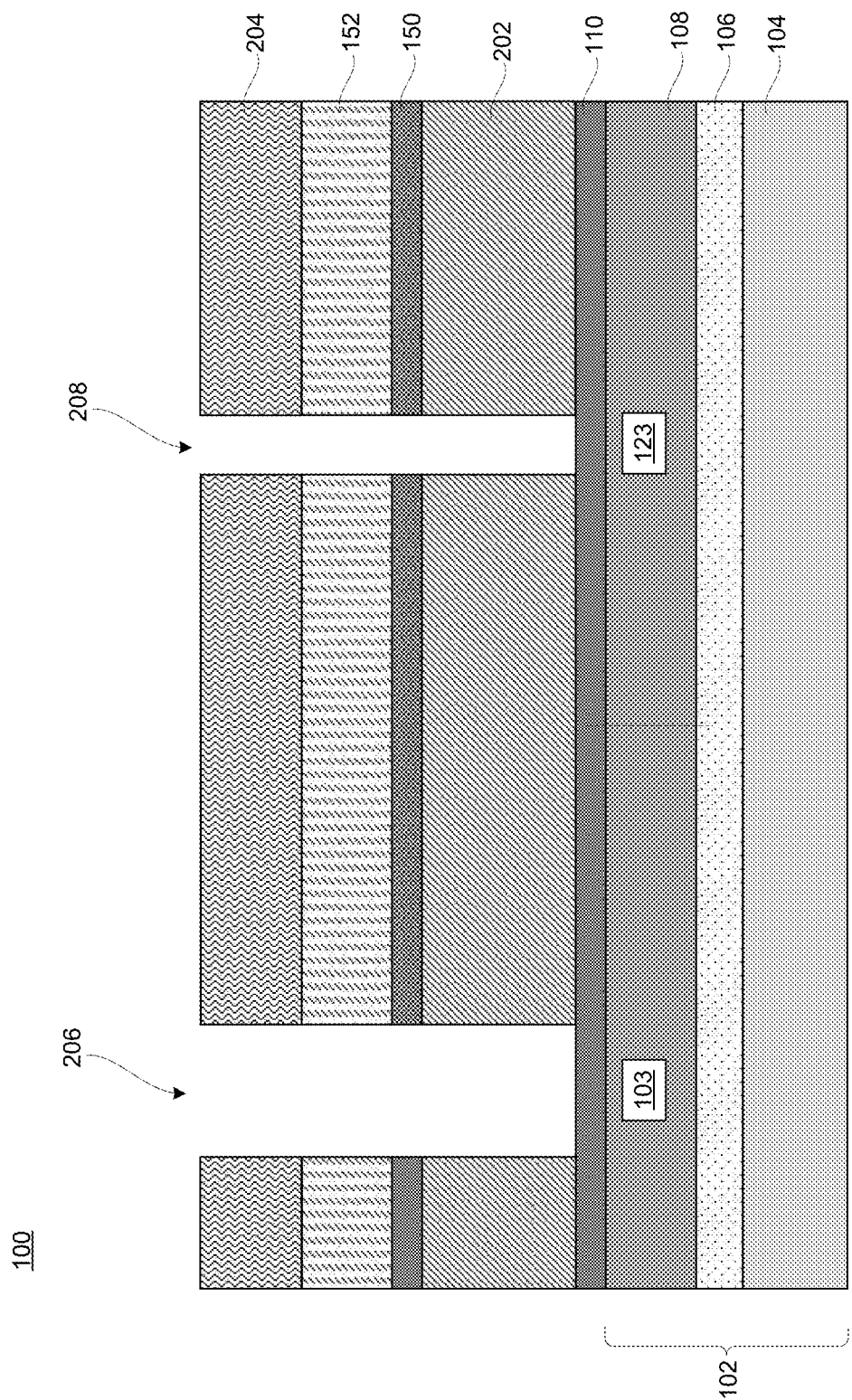

FIG. 3 depicts a cross-sectional view of semiconductor device 100 shown in an exemplary subsequent fabrication operation, in accordance with one or more embodiments. At the present fabrication stage, semiconductor device 100 may further include mask layer 204, an inner base opening 206, and a channel opening 208.

Mask 204 may be formed of a known mask material, such as a soft mask material, such as an organic planarization layer, or the like, upon the ILD 152. Mask 204 may be formed by depositing the mask 204 material by, for example, spin-on coating, PVD, CVD, ALD, or the like. Mask 204 can have a thickness of from about 30 nm to about 200 nm, although other thicknesses are within the contemplated scope.

Utilizing known patterning, lithography, etching, etc. techniques, undesired portions of mask 204, ILD 152, top spacer 150, and sacrificial layer 202 may be removed, thereby forming inner base opening 206 and channel opening 208, respectively, while desired portions thereof may be retained.

The bottom surface of inner base opening 206 and channel opening 208 may be coplanar with the top surface bottom spacer 110. The inner base opening 206 and channel opening 208 may expose respective facing vertical sidewalls of mask 204, ILD 152, top spacer 150, and sacrificial layer 202. The bottom or well surface of the inner base opening 206 and FET opening may be an exposed portion of the bottom spacer 110, respectively.

Figure 4:
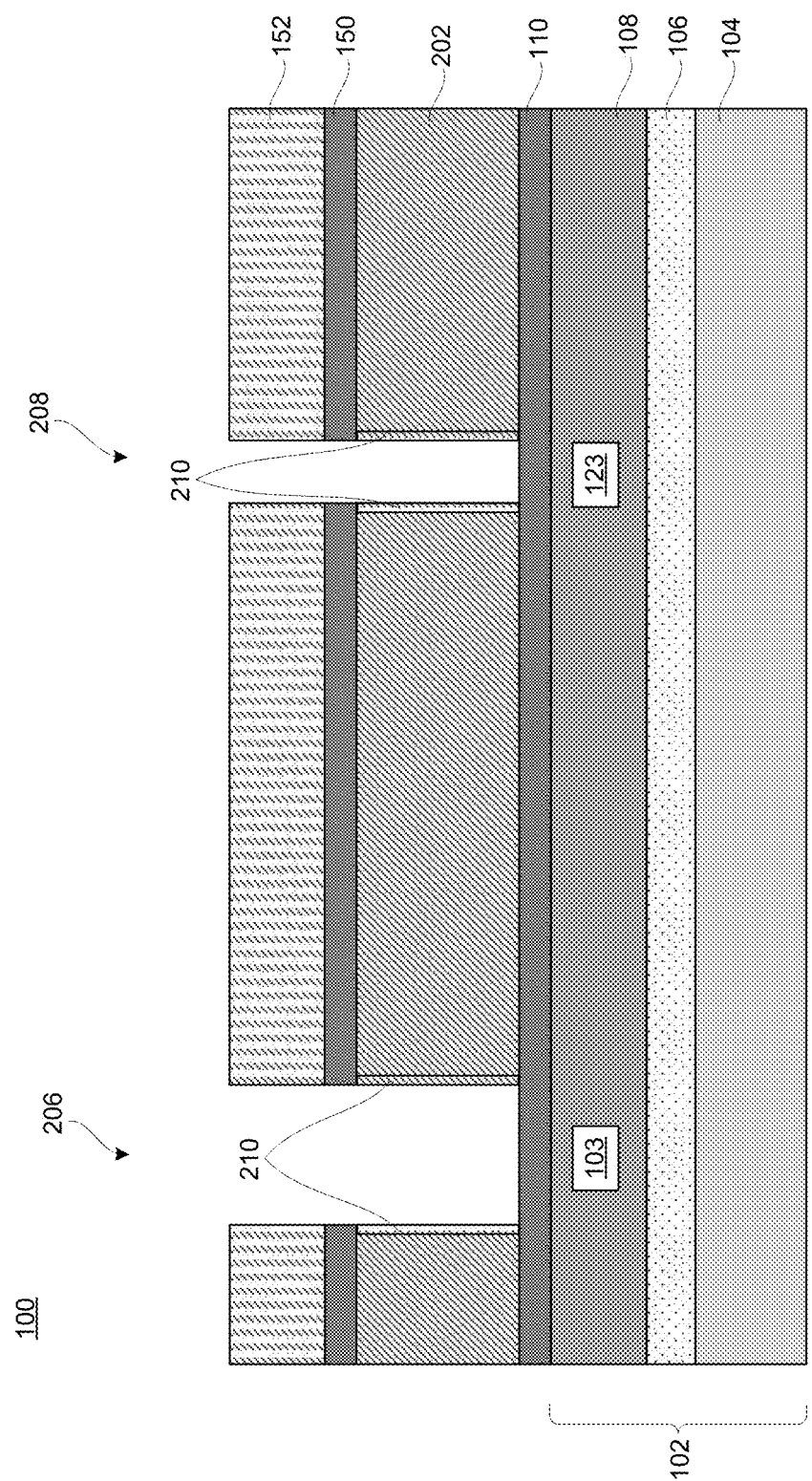

FIG. 4 depicts a cross-sectional view of semiconductor device 100 shown in an exemplary subsequent fabrication operation, in accordance with one or more embodiments. At the present fabrication stage, semiconductor device 100 may further include sidewall mask 210 upon the exposed sidewall(s) portion(s) of the sacrificial layer 202 of inner base opening 206 and include sidewall mask 210 upon the exposed sidewall(s) portion(s) of the sacrificial layer 202 of channel opening 208.

Sidewall mask 210 may be formed by allowing the exposed sidewall(s) portion(s) of the sacrificial layer 202 material (e.g., aSi) to oxidize, or the like. Further, at the present stage, mask 204 may be removed by a known substrative material removal technique or process, such as an etch, chemical mechanical polish (CMP), mechanical grind, or the like.

Figure 5:
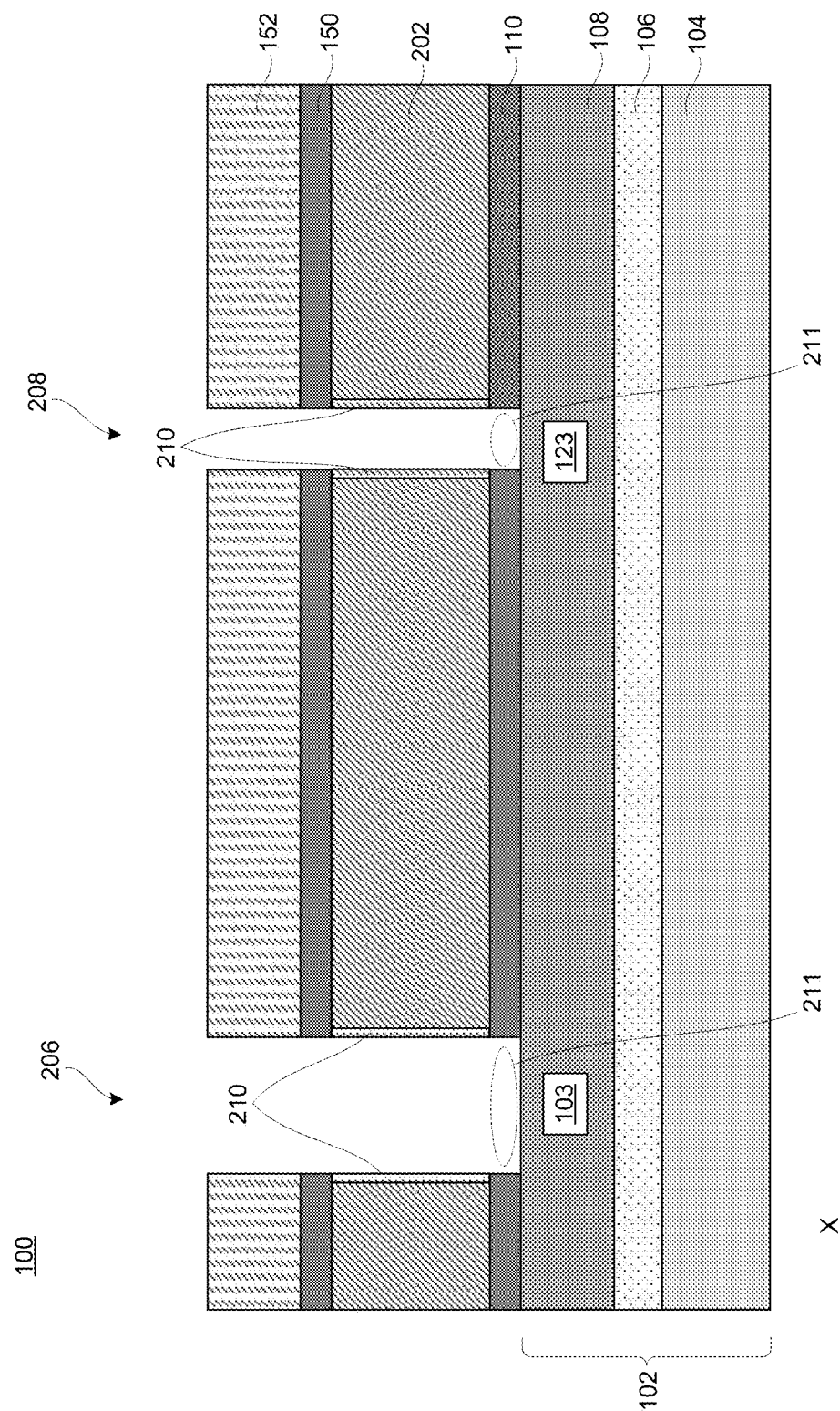

FIG. 5 depicts a cross-sectional view of semiconductor device 100 shown in an exemplary subsequent fabrication operation, in accordance with one or more embodiments. At the present fabrication stage, semiconductor device 100 may further include bottom spacer opening 211 within inner base opening 206 and include spacer opening 211 within channel opening 208.

Utilizing known patterning, lithography, etching, etc. techniques, undesired portions of bottom spacer 110 may be removed, thereby forming bottom spacer opening 211 while desired portions of bottom spacer 110 may be retained. Alternatively, other known subtractive removal techniques, such as punch through, or the like, to form bottom spacer opening 211.

Upon the formation of bottom spacer opening 211, the inner base opening 206 is extended to expose at least a portion of collector region 103. Likewise, upon the formation of bottom spacer opening 211, the channel opening 208 is extended to expose at least a portion of source/drain region 113. For example, the inner base opening 206 and channel opening 208 are extended to expose at least a respective portion of the top surface of substrate 102 and/or semiconductor layer 108.

Figure 6:
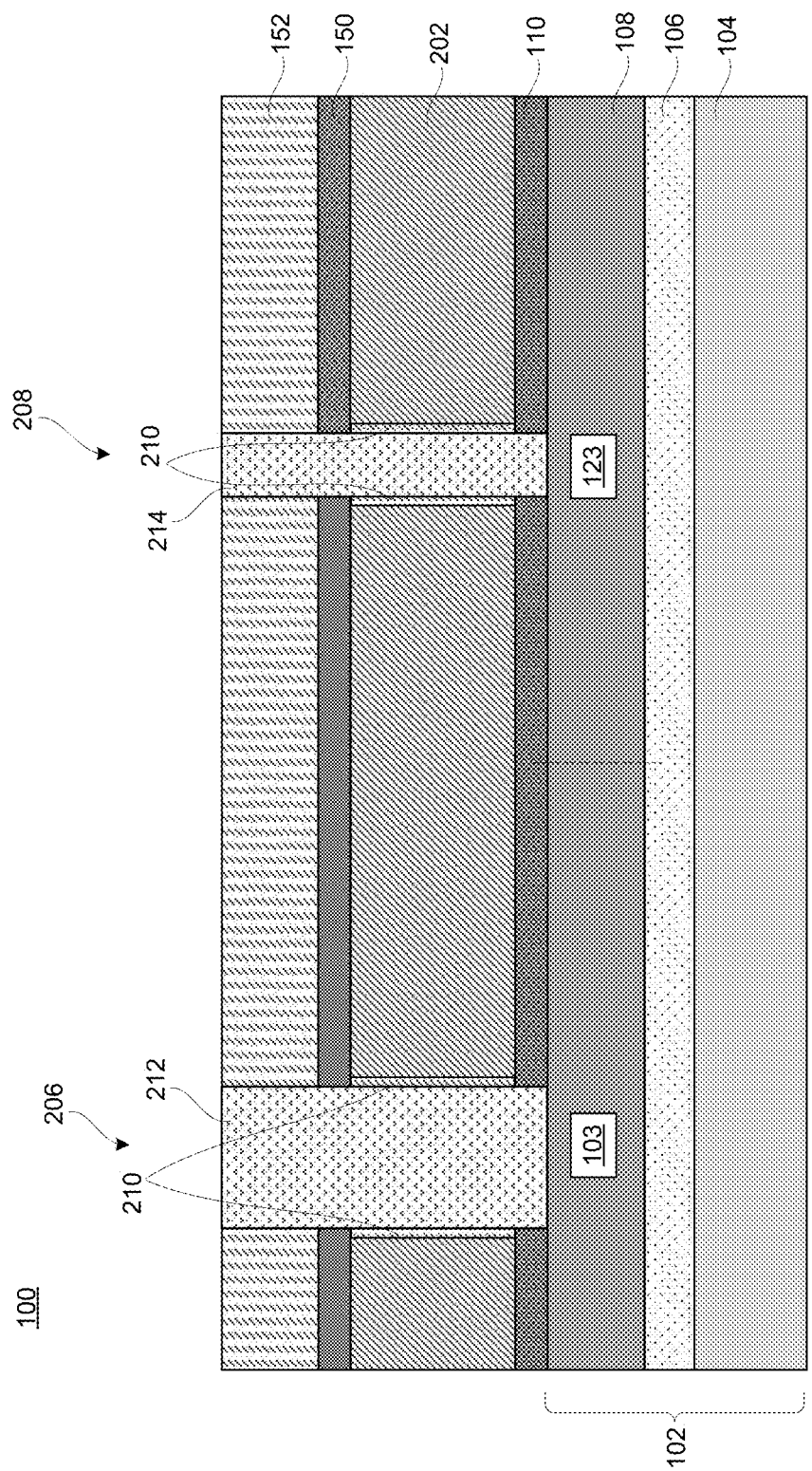

FIG. 6 depicts a cross-sectional view of semiconductor device 100 shown in an exemplary subsequent fabrication operation, in accordance with one or more embodiments. At the present fabrication stage, semiconductor device 100 may further include inner base 212 within inner base opening 206 and may further include channel 214 within channel opening 208.

In some embodiments, inner base 212 and channel 214 are formed by epitaxially growing one layer and then the next until the desired number and desired thicknesses of such layers are achieved. For example, inner base 212 may be epitaxially grown to fill inner base opening 206 upon the exposed portion of collector region 103. Further, FET epitaxy may be epitaxially grown to fill channel opening 208 upon the exposed portion of the source region 123. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

Epitaxial materials, such as epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of BJT and FET, respectively. For example, when semiconductor device 100 includes BJT 101 in the PNP configuration and includes FET 121 in the pFET configuration, inner base 212 and channel 214 may include n-type dopants. Alternatively, when semiconductor device 100 includes BJT 101 in the NPN configuration and includes FET 121 in the nFET configuration, inner base 212 and channel 214 may include p-type dopants.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, di silane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, subsequent to the formation of inner base 212 and channel 214, the top surface of semiconductor device 100 may be planarized by a CMP, or the like. For example, the top surface of ILD 152, the top surface of inner base 212, and the top surface of channel 214 are substantially coplanar, substantially horizontal, etc.

Figure 7:
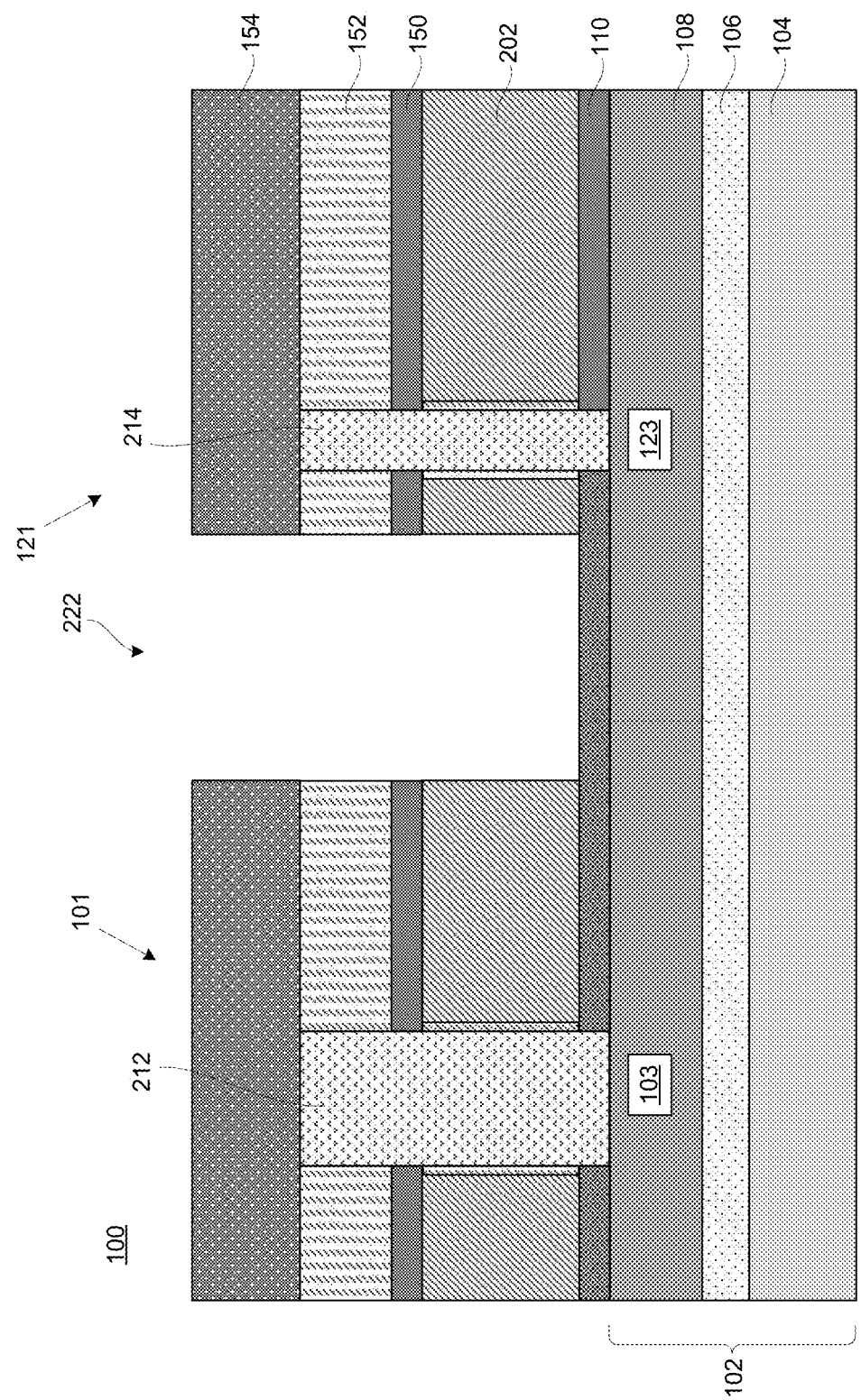

FIG. 7 depicts a cross-sectional view of semiconductor device 100 shown in an exemplary subsequent fabrication operation, in accordance with one or more embodiments. At the present fabrication stage, semiconductor device 100 may further include mask 154 and BJT/FET opening 222.

Mask 154 may be formed of a known mask material, such as a hard mask material, such as SiN, SiC, SiCO, or the like, upon ILD 152. Mask 154 may be formed by depositing the mask 154 material by, for example, PVD, CVD, ALD, or the like. Mask 154 can have a thickness of from about 5 nm to about 60 nm, although other thicknesses are within the contemplated scope.

Utilizing known patterning, lithography, etching, etc. techniques, undesired portions of mask 154, ILD 152, top spacer 150, and sacrificial layer 202 may be removed, thereby forming BJT/FET opening 222 while desired portions of mask 154, ILD 152, top spacer 150, and sacrificial layer 202 may be retained.

The BJT/FET opening 222 may expose respective facing vertical sidewalls of mask 154, ILD 152, top spacer 150, and sacrificial layer 202. The bottom or well surface of the BJT/FET opening 222 may be an exposed portion of the bottom spacer 110.

BJT/FET opening 222 may define one or more boundaries of outer base region 122 of BJT 101 by way of the defined sidewall(s) of sacrificial layer 202 that is exposed by BJT/FET opening 222. Similarly, BJT/FET opening 222 may define one or more boundaries of gate region 120 of FET 121 by way of the defined sidewall(s) of sacrificial layer 202 that is exposed by BJT/FET opening 222. In other words, BJT 101 is at least partially defined on one side of BJT/FET opening 222 while FET 121 is at least partially defined on the opposed side of BJT/FET opening 222.

Figure 8:
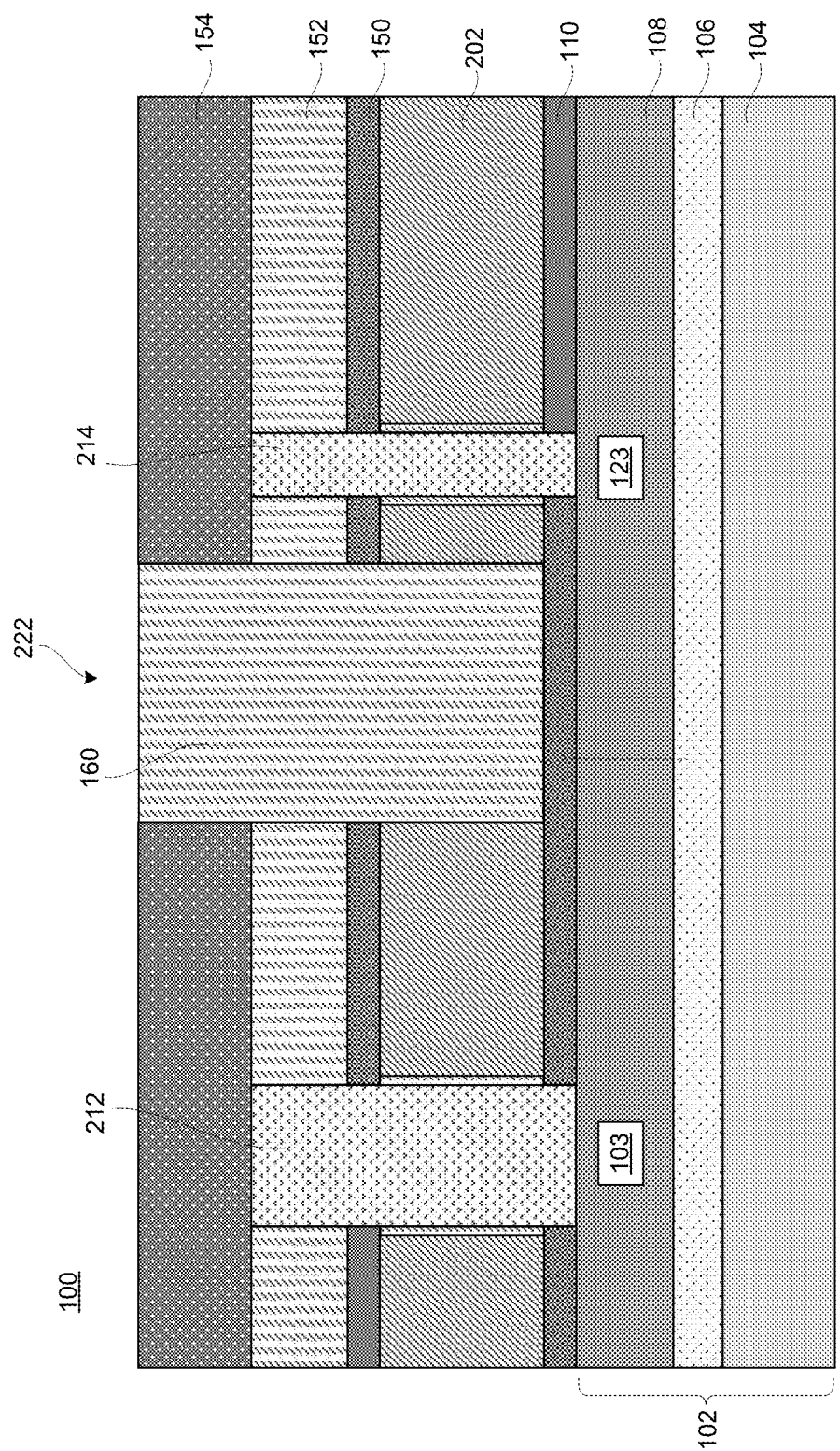

FIG. 8 depicts a cross-sectional view of semiconductor device 100 shown in an exemplary subsequent fabrication operation, in accordance with one or more embodiments. At the present fabrication stage, semiconductor device 100 may further include ILD 160 within the BJT/FET opening 222.

ILD 160 may be formed of a known dielectric material, such as $SiO_2$, SiN, a combination, or the like, within the BJT/FET opening 222. ILD 160 may be formed by depositing the ILD 160 material by, for example, PVD, CVD, ALD, or the like. For example, ILD 160 material may be formed upon the exposed respective facing vertical sidewalls of mask 154, ILD 152, top spacer 150, sacrificial layer 202, and upon the bottom or well surface of the exposed portion of the bottom spacer 110. Excess ILD 160 material above the top surface of mask 154 may be removed by a known substrative material removal technique or process, such as an etch, CMP, or the like.

Figure 9:
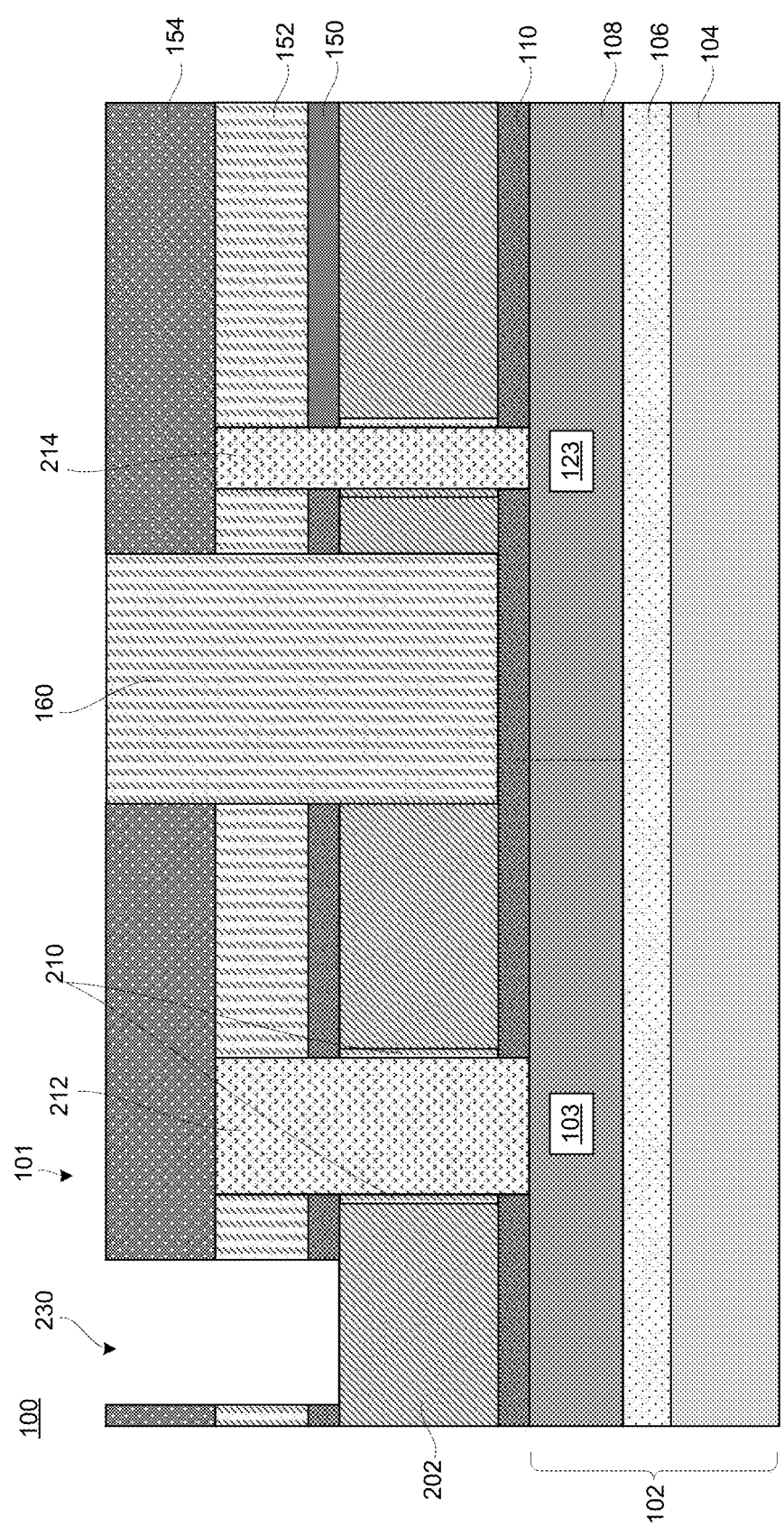

FIG. 9 depicts a cross-sectional view of semiconductor device 100 shown in an exemplary subsequent fabrication operation, in accordance with one or more embodiments. At the present fabrication stage, semiconductor device 100 may further include base trench 230.

Utilizing known patterning, lithography, etching, etc. techniques, undesired portions of mask 154, ILD 152, and top spacer 150, may be removed, thereby forming base trench 230, while desired portions of mask 154, ILD 152, and top spacer 150, may be retained.

The base trench 230 may expose respective facing vertical sidewalls of mask 154, ILD 152, and top spacer 150. The bottom or well surface of the base trench 230 may be an exposed portion of the sacrificial layer 202 within BJT 101.

Figure 10:
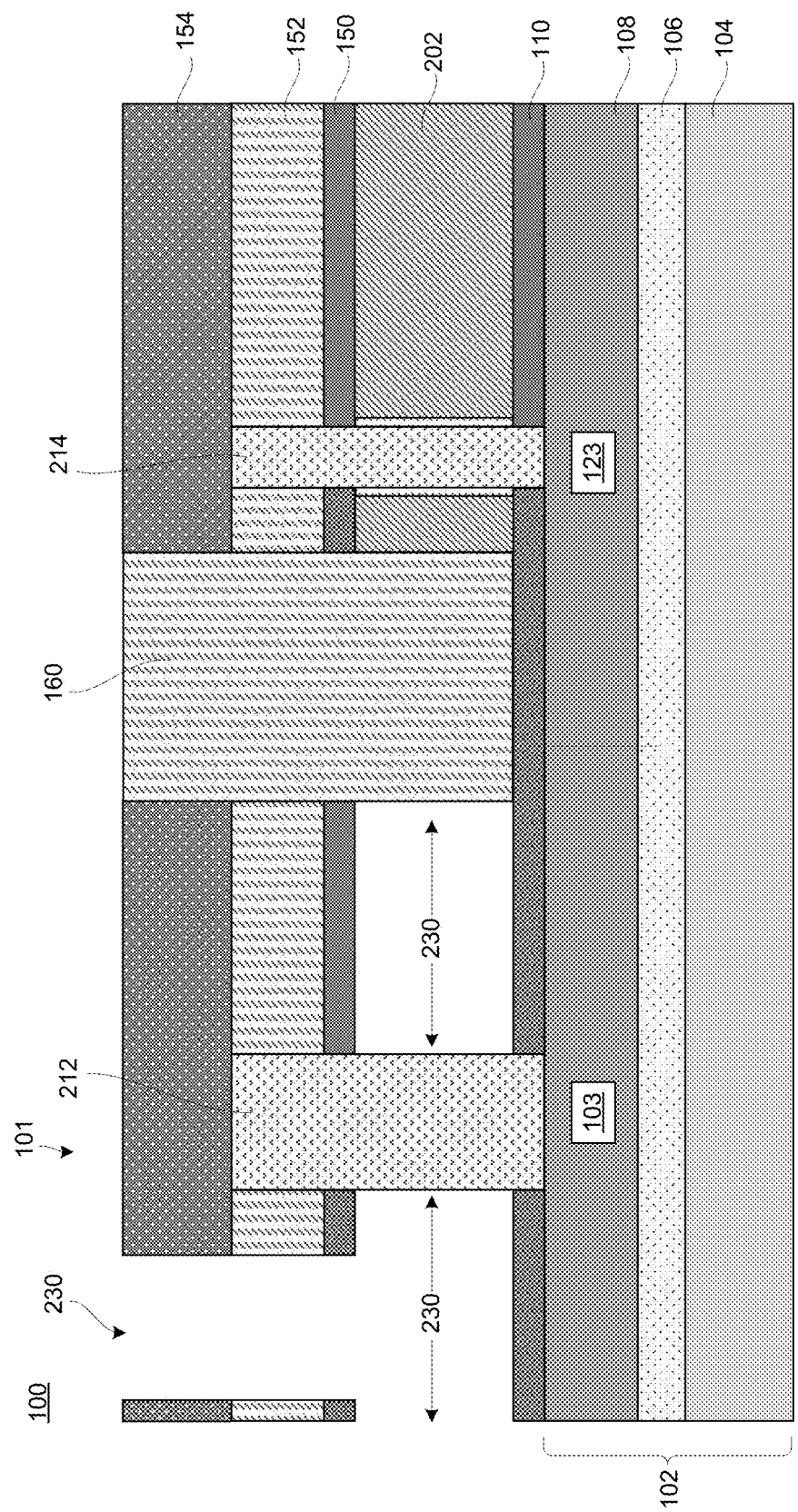

FIG. 10 depicts a cross-sectional view of semiconductor device 100 shown in an exemplary subsequent fabrication operation, in accordance with one or more embodiments. At the present fabrication stage, the sacrificial layer 202 and the sidewall mask 210 within BJT 101 may be removed.

Utilizing known patterning, lithography, etching, etc. techniques, sacrificial layer 202 and sidewall mask 210 within BJT 101 may be removed via base trench 230. The substrative technique to remove sacrificial layer 202 and mask 210 may generally be chosen to be selective of the material of inner base 212. That is, the material(s) of sacrificial layer 202 and sidewall mask 210 may be removed while the material of inner base 212 may be retained.

Upon removal of sacrificial layer 202 and sidewall mask 210, the base trench 230 may be generally enlarged. For example, as depicted, base trench 230 may be laterally or horizontally enlarged. Upon removal of sacrificial layer 202, at least portion(s) of lower surface of top spacer 150 may be exposed within BJT 101 and at least portion(s) of the top surface of lower spacer 110 may be exposed within BJT 101.

Base trench 230 may define one or more boundaries of outer base region 122 of BJT 101 by way of a sidewall(s) exposed by base trench 230 (e.g., opposing sidewall(s) to the sidewall(s) of outer base region 122 as defined by ILD 160).

Figure 11:
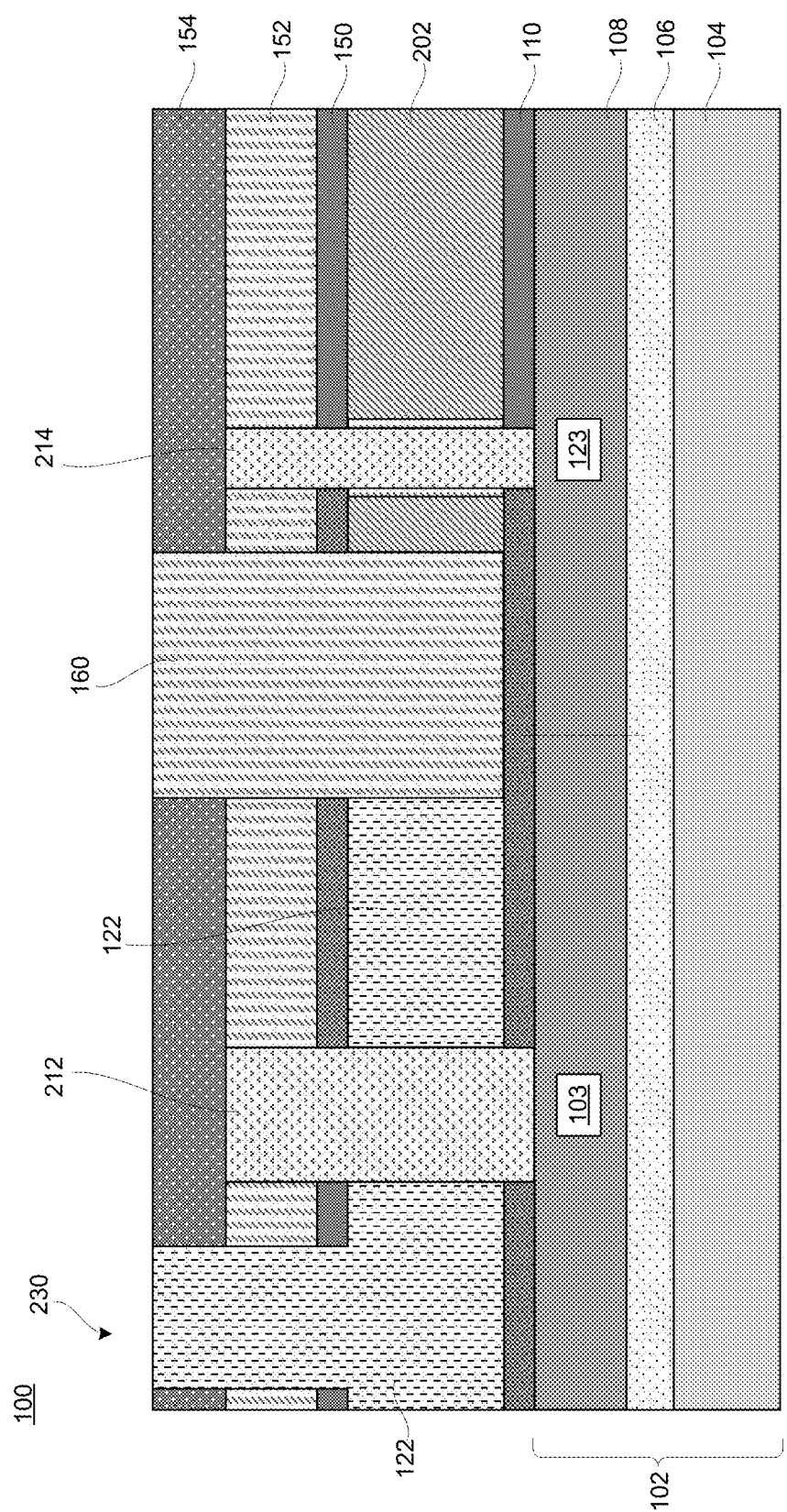

FIG. 11 depicts a cross-sectional view of semiconductor device 100 shown in an exemplary subsequent fabrication operation, in accordance with one or more embodiments. At the present fabrication stage, semiconductor device 100 may further include outer base region 122 within the base trench 230 and around inner base 212.

In the PNP configuration, outer base region 122 may be formed of a known N-type doped semiconductor material(s), such as N-type doped Phosphorus, Arsenic, Antimony, or the like, within base trench 230. Outer base region 122 may be formed by depositing the outer base region 122 material by, for example, PVD, CVD, ALD, or the like, within base trench 230 while simultaneously or subsequently doping the outer base region 122 material with N-type dopants.

In the NPN configuration, outer base region 122 may be formed of a known P-type doped semiconductor material(s), such as P-type doped Boron, BF2, or the like, within base trench 230. Outer base region 122 may be formed by depositing the outer base region 122 material by, for example, PVD, CVD, ALD, or the like, within base trench 130 while simultaneously or subsequently doping the outer base region 122 material with P-type dopants.

Outer base region 122 material may be formed upon the exposed lower surface or exposed lower surface portion(s) of top spacer 150, may be formed upon the exposed upper surface or exposed upper surface portion(s) of lower spacer 110, and/or may be formed upon and around sidewall portion(s) of inner base 212. Further, outer base region 122 material may be formed upon sidewall(s) of top spacer 150, may be formed upon sidewall(s) of ILD 152, and/or may be formed upon sidewall(s) of mask 154.

Subsequently, outer base region 122, mask 154, and ILD 160 may be planarized by a known substrative material removal technique or process, such as an etch, CMP, or the like. As such, the top surface of outer base region 122, the top surface of mask 154, and the top surface of ILD 160 may be coplanar.

Outer base region 122 may respectively include the substantially horizontal portion the substantially vertical potion. As such, outer base region 122 may have a general "L" shape, backward "L" shape, upside down "T" shape, or the like. The substantially vertical portion includes a top surface and the substantially horizonal portion also includes a top surface. The top surface of the substantially vertical portion outer base region 122 may be above the top surface of the substantially horizontal portion outer base region 122. Due to the fabrication stages described herein, the top surface of the substantially vertical portion outer base region 122 may be substantially coplanar with the top surface of mask 154 and/or ILD 160 and may be above the top surface of channel 212, top spacer 150, or the like.

Figure 12:
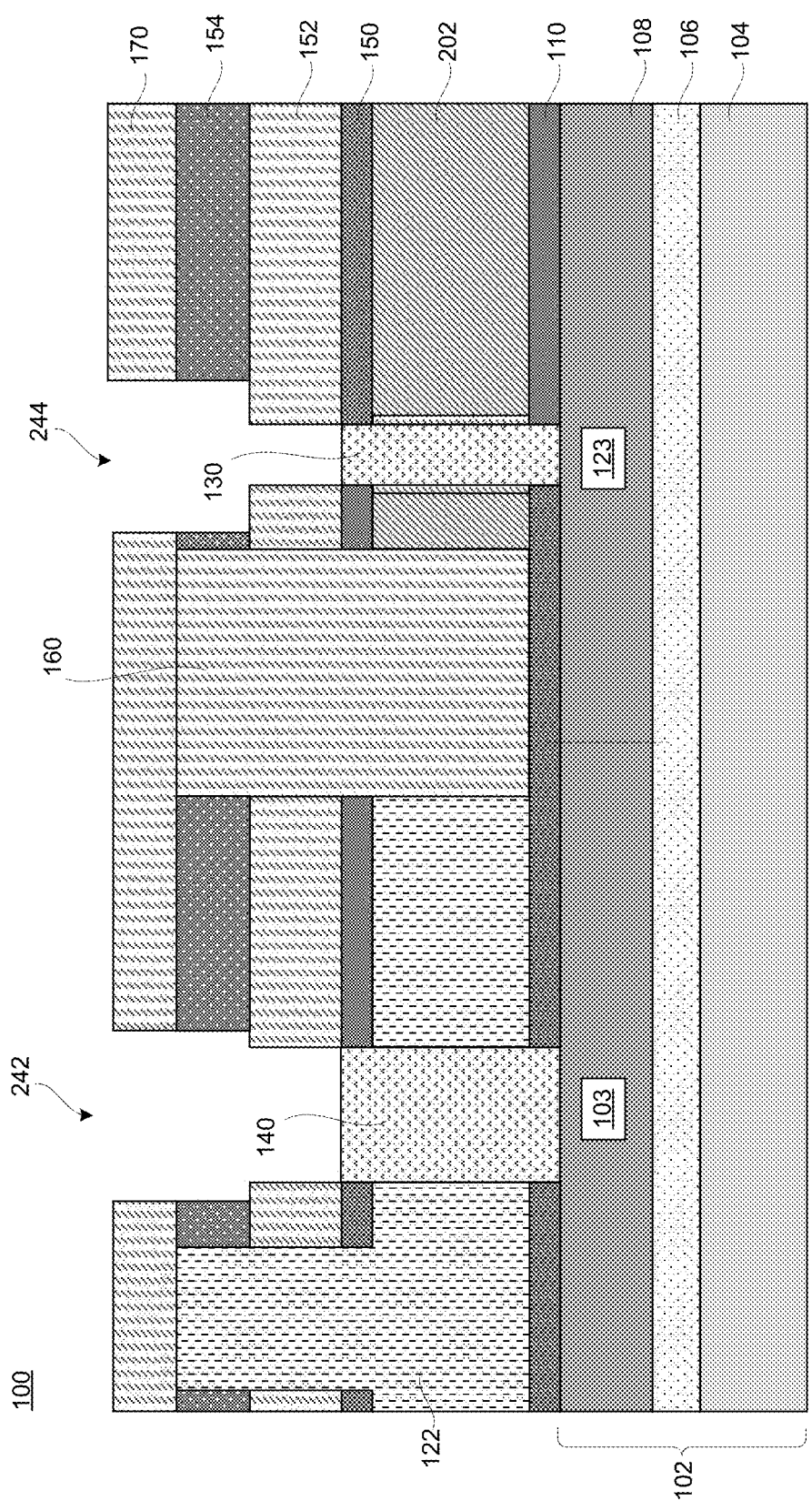

FIG. 12 depicts a cross-sectional view of semiconductor device 100 shown in an exemplary subsequent fabrication operation, in accordance with one or more embodiments. At the present fabrication stage, semiconductor device 100 may further include ILD 170, emitter opening 242, and drain opening 244. Further, at the present fabrication stage, inner base 212 may be recessed, thereby forming inner base region 140. Even further, at the present fabrication stage, channel 214 may also be recessed, thereby forming channel region 130.

ILD 170 may be formed of a known dielectric material, such as $SiO_2$, SiN, a combination, or the like, upon mask 154, upon outer base region 122, and/or upon ILD 160. ILD 170 may be formed by depositing the ILD 170 material by, for example, PVD, CVD, ALD, or the like. ILD 170 can have a thickness of from about 20 nm to about 100 nm, although other thicknesses are within the contemplated scope.

Utilizing known patterning, lithography, etching, etc. techniques, undesired portions of ILD 170 and undesired portions of mask 154 (e.g., above inner base 212 and above channel 214, respectively) may be removed. The removed portions of ILD 170 and removed portions of mask 154 may form emitter opening 242 and may form drain opening 244, respectively. Emitter opening 242 and drain opening 244 may expose or include facing sidewall(s) of ILD 170, may expose or include facing sidewalls of mask 154, may expose a portion of inner base 212 & ILD 152, may and may expose a portion of channel 214 & ILD 152, respectively. In some embodiments, as depicted, emitter opening 242 and drain opening 244 may have at least a portion that is wider than the underlying inner base 212 and channel 214, there below.

The exposed inner base 212 and channel 214 may at least be partially recessed, utilizing known patterning, lithography, etching, etc. techniques. In some embodiments, as depicted, inner base 212 and channel 214 may be recessed so that the top surface of inner base 212 and the top surface of channel 214 are substantially coplanar with the top surface of top spacer 150. As described above, the recessed inner base 212 forms inner base region 140 and the recessed channel 214 forms channel region 130. The recessed inner base 212 may effectively enlarge emitter opening 242 downward and the recessed channel 214 may effectively enlarge drain opening 244 downward.

Figure 13:
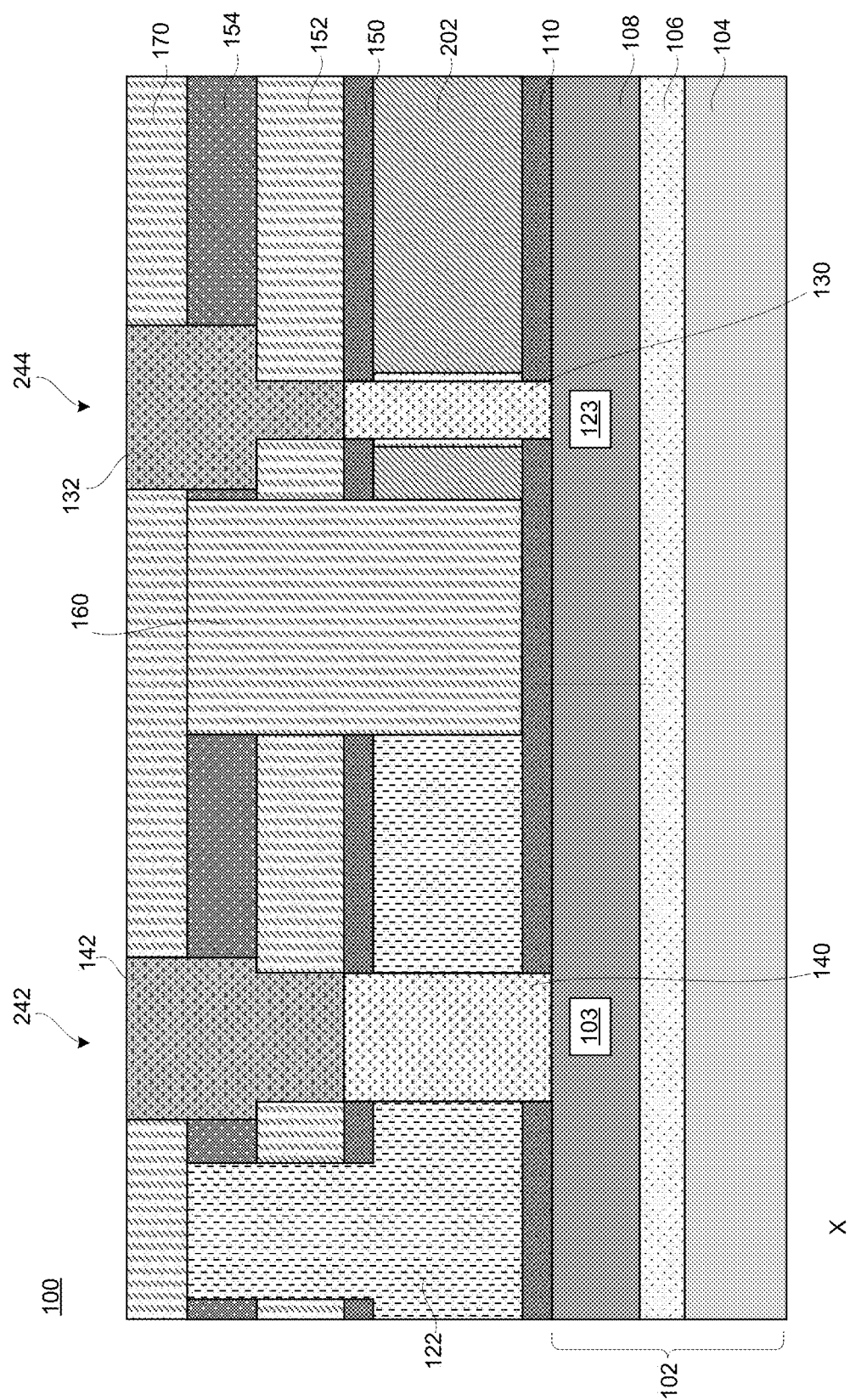

FIG. 13 depicts a cross-sectional view of semiconductor device 100 shown in an exemplary subsequent fabrication operation, in accordance with one or more embodiments. At the present fabrication stage, semiconductor device 100 may further include emitter region 142 within emitter opening 242 and may further include drain region 132 within drain opening 244.

In some embodiments, emitter region 142 and drain region 132 are formed by epitaxially growing one layer and then the next until the desired number and desired thicknesses of such layers are achieved. For example, emitter region 142 may be epitaxially grown to fill emitter opening 242 upon inner base region 140. Further, drain region 132 may be epitaxially grown to fill drain opening 244 upon the exposed portion of the channel region 130.

In the PNP configuration, emitter region 142 and drain region 132 may include P type dopants. Alternatively, in the NPN configuration, emitter region 142 and drain region 132 may include N type dopants.

In some embodiments, subsequent to the formation of emitter region 142 and drain region 132, the top surface of semiconductor device 100 may be planarized by a CMP, or the like. For example, the top surface of ILD 170, the top surface of emitter region 142, and the top surface of drain region 132 are substantially coplanar, substantially horizontal, or the like.

Figure 14:

FIG. 14 depicts a cross-sectional view of semiconductor device 100 shown in an exemplary subsequent fabrication operation, in accordance with one or more embodiments. At the present fabrication stage, semiconductor device 100 may further include ILD 172 and may further include gate trench 260.

ILD 172 may be formed of a known dielectric material, such as $SiO_2$, SiN, a combination, or the like, upon the top surface of ILD 170, upon the top surface of emitter region 142, and upon the top surface of drain region 132. ILD 172 may be formed by depositing the ILD 172 material by, for example, PVD, CVD, ALD, or the like. ILD 172 can have a thickness of from about 5 nm to about 50 nm, although other thicknesses are within the contemplated scope.

Utilizing known patterning, lithography, etching, etc. techniques, undesired portions of ILD 172, ILD 170, mask 154, ILD 152, and upper spacer 150 may be removed, thereby forming gate trench 260, while desired portions of ILD 172, ILD 170, mask 154, ILD 152, and upper spacer 150, may be retained.

The gate trench 260 may expose respective facing vertical sidewalls of ILD 172, ILD 170, mask 154, ILD 152, and upper spacer 150. The bottom or well surface of the gate trench 260 may be an exposed portion of the sacrificial layer 202 within FET 121.

Figure 15:
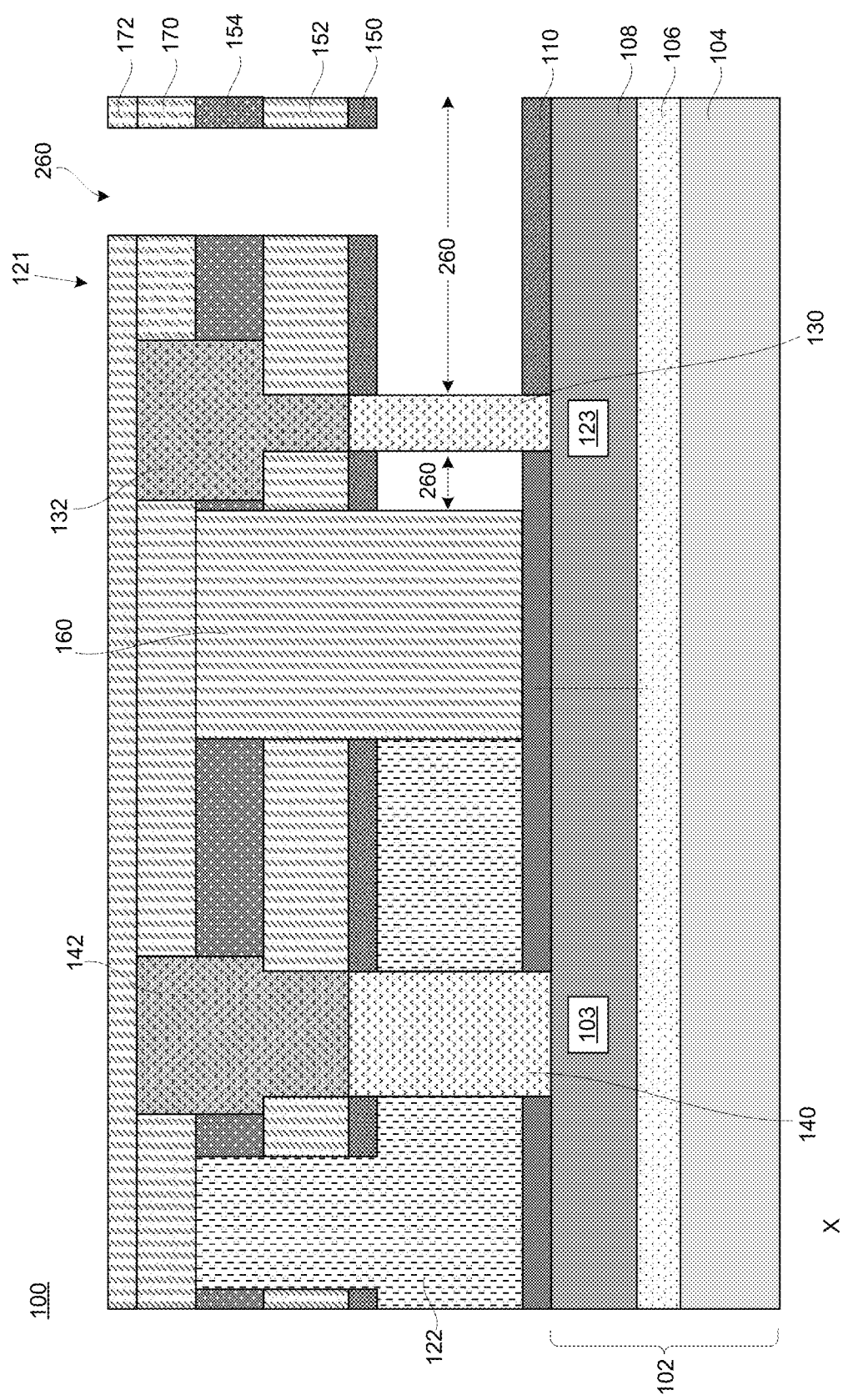

FIG. 15 depicts a cross-sectional view of semiconductor device 100 shown in an exemplary subsequent fabrication operation, in accordance with one or more embodiments. At the present fabrication stage, the sacrificial layer 202 and the sidewall mask 210 within FET 121 may be removed.

Utilizing known patterning, lithography, etching, etc. techniques, sacrificial layer 202 and sidewall mask 210 within FET 121 may be removed via gate trench 260. The substrative technique to remove sacrificial layer 202 and sidewall mask 210 may generally be chosen to be selective of the material of channel region 130. That is, the material(s) of sacrificial layer 202 and sidewall mask 210 may be removed while the material of channel region 130 may be retained.

Upon removal of sacrificial layer 202 and sidewall mask 210, the gate trench 260 may be generally enlarged. For example, as depicted, gate trench 260 may be laterally or horizontally enlarged. Upon removal of sacrificial layer 202, portion(s) of lower surface of top spacer 150 may be exposed within FET 121 and portion(s) of the top surface of lower spacer 110 may be exposed within FET 121. Similarly, upon removal of sidewall mask 210, portion(s) of channel region 160 may be exposed within gate trench 260.

Gate trench 260 may define one or more boundaries of gate region 120 of FET 121 by way of a sidewall(s) exposed by gate trench 260 (e.g., opposing sidewall(s) to the sidewall(s) of gate region 120 defined by ILD 160).

Figure 16:

FIG. 16 depicts a cross-sectional view of semiconductor device 100 shown in an exemplary subsequent fabrication operation, in accordance with one or more embodiments. At the present fabrication stage, semiconductor device 100 may further include gate region 120 within the gate trench 260 and around channel region 130.

Gate region 120 may be formed of a conductive material or metal, such as TiN, TiC, TiAlC, TaN, W, Al, Work Function Metal(s), or the like, within gate trench 260. Gate region 120 may be formed by depositing the gate region 120 material by, for example, plating, PVD, CVD, ALD, or the like, within gate trench 260.

Gate region 120 material may be formed upon the exposed lower surface or exposed lower surface portion(s) of top spacer 150, may be formed upon the exposed upper surface or exposed upper surface portion(s) of lower spacer 110, and/or may be formed upon and around sidewall portion(s) of channel region 130. Further, gate region 122 material may be formed upon sidewall(s) of top spacer 150, may be formed upon sidewall(s) of ILD 152, may be formed upon sidewall(s) of mask 154, may be formed upon sidewall(s) of ILD 170, and/or may be formed upon sidewall(s) of ILD 172.

In some embodiments, as depicted, a gate dielectric liner 118 may be formed upon the exposed inner surfaces of gate trench 260 prior to the formation of gate region 120 therein. Gate dielectric liner 118 may be formed of a known dielectric material(s), such as $SiO_2$, $HfO_2$, $ZrO_2$, $HfZrO_2$, HfAlOx, HfSiOx, HfLaOx, or the like. Gate dielectric liner 118 may be formed by depositing the gate dielectric liner 118 material(s) by, for example, PVD, CVD, ALD, or the like. Gate dielectric liner 118 can have a thickness of from about 1 nm to about 6 nm, although other thicknesses are within the contemplated scope.

For example, gate dielectric liner 118 material may be formed upon the exposed lower surface or exposed lower surface portion(s) of top spacer 150, may be formed upon the exposed upper surface or exposed upper surface portion(s) of lower spacer 110, and/or may be formed upon and around sidewall portion(s) of channel region 130. Further, gate dielectric liner 118 material may be formed upon sidewall(s) of top spacer 150, may be formed upon sidewall(s) of ILD 152, may be formed upon sidewall(s) of mask 154, may be formed upon sidewall(s) of ILD 170, and/or may be formed upon sidewall(s) of ILD 172. In this embodiment, after the formation of gate dielectric liner 118, gate region 120 material may be formed thereupon, and may generally fill the remaining gate trench 260.

Subsequently, gate region 120, ILD 172, and/or gate dielectric liner 118 may be planarized by a known substrative material removal technique or process, such as an etch, CMP, or the like. As such, the top surface of gate region 120, the top surface of ILD 172, and/or the top surface of gate dielectric liner 118 may be coplanar.

Gate region 120 may respectively include the substantially horizontal portion and the substantially vertical potion. As such, gate region 120 may have a general "L" shape, backward "L" shape, upside down "T" shape, or the like. The substantially vertical portion includes a top surface and the substantially horizonal portion also includes a top surface. The top surface of the substantially vertical portion of gate region 122 may be above the top surface of the substantially horizontal portion of gate region 122. Due to the fabrication stages described herein, the top surface of the substantially vertical portion of gate region 122 may be substantially coplanar with the top surface of ILD 170, ILD 170, mask 154, or the like.

For clarity, as is depicted, due to the sequential fabrication stages described herein, the top surface of outer base region 122 may be below the top surface of gate region 120. In alternative embodiments, the gate region 120 may first be formed whereby the top surface thereof may be below the top surface of outer base region 122.

For clarity, as is depicted, due to the fabrication stages described herein, the top surface of emitter region 142 and the top surface of drain region 132 may be between the top surface of outer base region 122 and the top surface of gate region 120.

Figure 17:
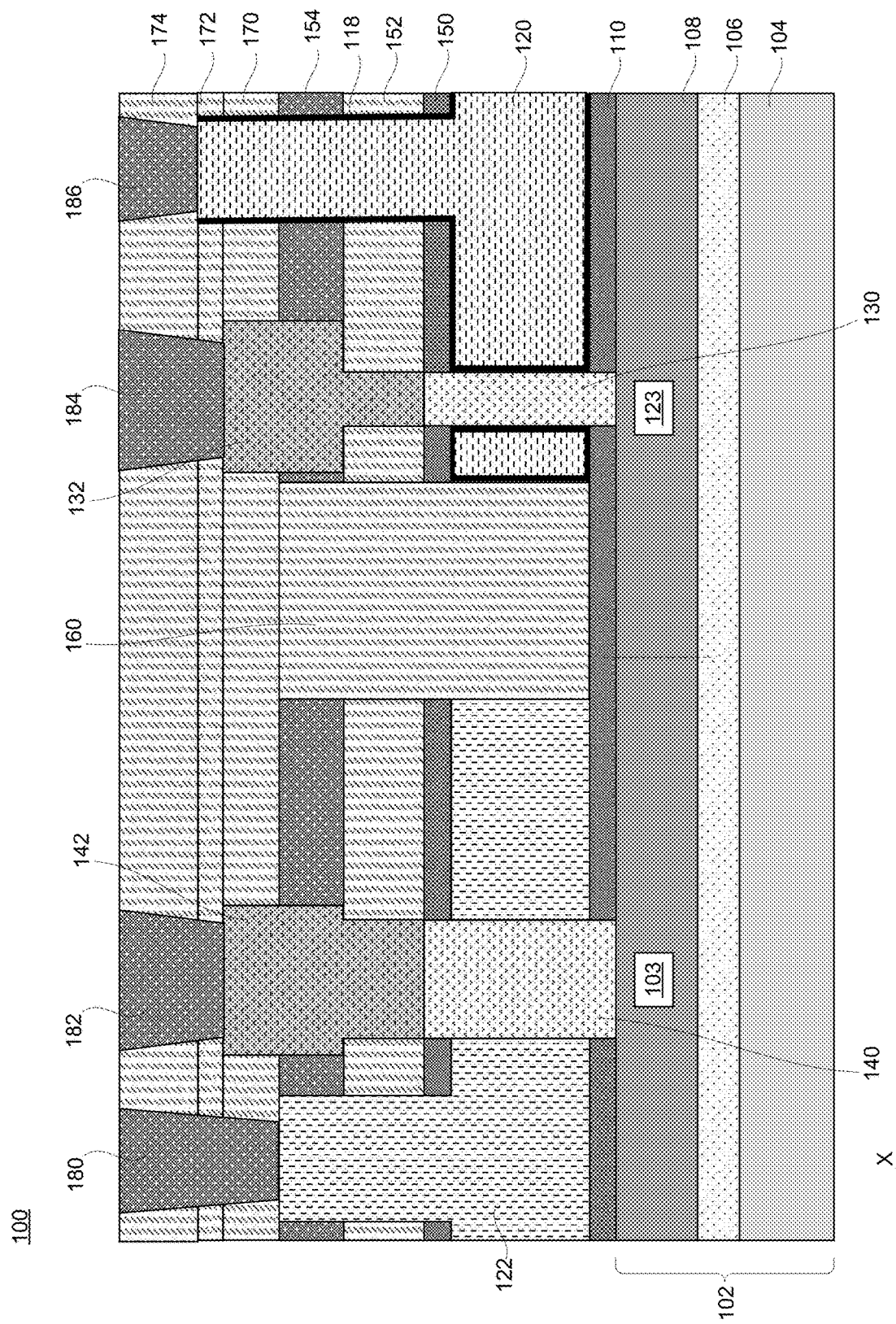

FIG. 17 depicts a cross-sectional view of semiconductor device 100 shown in an exemplary subsequent fabrication operation, in accordance with one or more embodiments. At the present fabrication stage, semiconductor device 100 may further include ILD 174, base contact 180, emitter contact 182, drain contact 184, and/or gate contact 186.

ILD 174 may be formed of a known dielectric material, such as $SiO_2$, SiN, a combination, or the like, upon the top surface of gate region 120, upon the top surface of ILD 172, and/or upon the top surface of gate dielectric liner 118. ILD 174 may be formed by depositing the ILD 174 material by, for example, PVD, CVD, ALD, or the like. ILD 174 can have a thickness of from about 10 nm to about 60 nm, although other thicknesses are within the contemplated scope.

The base contact 180, emitter contact 182, drain contact 184, and/or gate contact 186, may be collectively referred herein as terminals, contacts, or the like, and may be formed in one or more of the ILD(s) 170, 172, and/or 174. One or more of the contacts may be a conductive line, plane, vertical interconnect access (VIA), plug, pad, or other conductive interconnect feature, and may be formed using suitable formation methods, such as damascene, dual-damascene, deposition, plating, combinations thereof, or the like.

In some embodiments, one or more mask layers (not shown) may aid in formation of contact openings in the ILD 170, 172, and/or 174. In some embodiments, the contact opening(s) is formed by a via-first process. In other embodiments, the contact opening(s) is formed by a trench-first process. Subsequently, the contact openings may be filled with suitable conductive material(s). As depicted, the contact opening fabrication process or technique may produce generally sloped contact sidewalls which may result in a trapezoidal contacts that include two substantially parallel sides (i.e., upper and lower surfaces) and outwardly sloped side(s) or sidewall(s) (i.e., sides become further away from the bottom of the contact) that may share a bisector line of symmetry.

In some embodiments, as the contacts may be simultaneously formed by the same additive fabrication process, as described, and may share the same orientation of outwardly sloped sides or sidewall(s), as depicted.

In some embodiments, the contact(s) may include the conductive material and may further include conductive barrier layer(s) (not shown) that line the sidewalls and bottom surfaces of the respective contact conductive material(s). A planarization process, such as CMP process or a mechanical grinding process, may remove excess contact material(s) and may planarize the top surface of ILD 174 and the respective top surfaces of base contact 180, emitter contact 182, drain contact 184, and/or gate contact 186.

Figure 18:
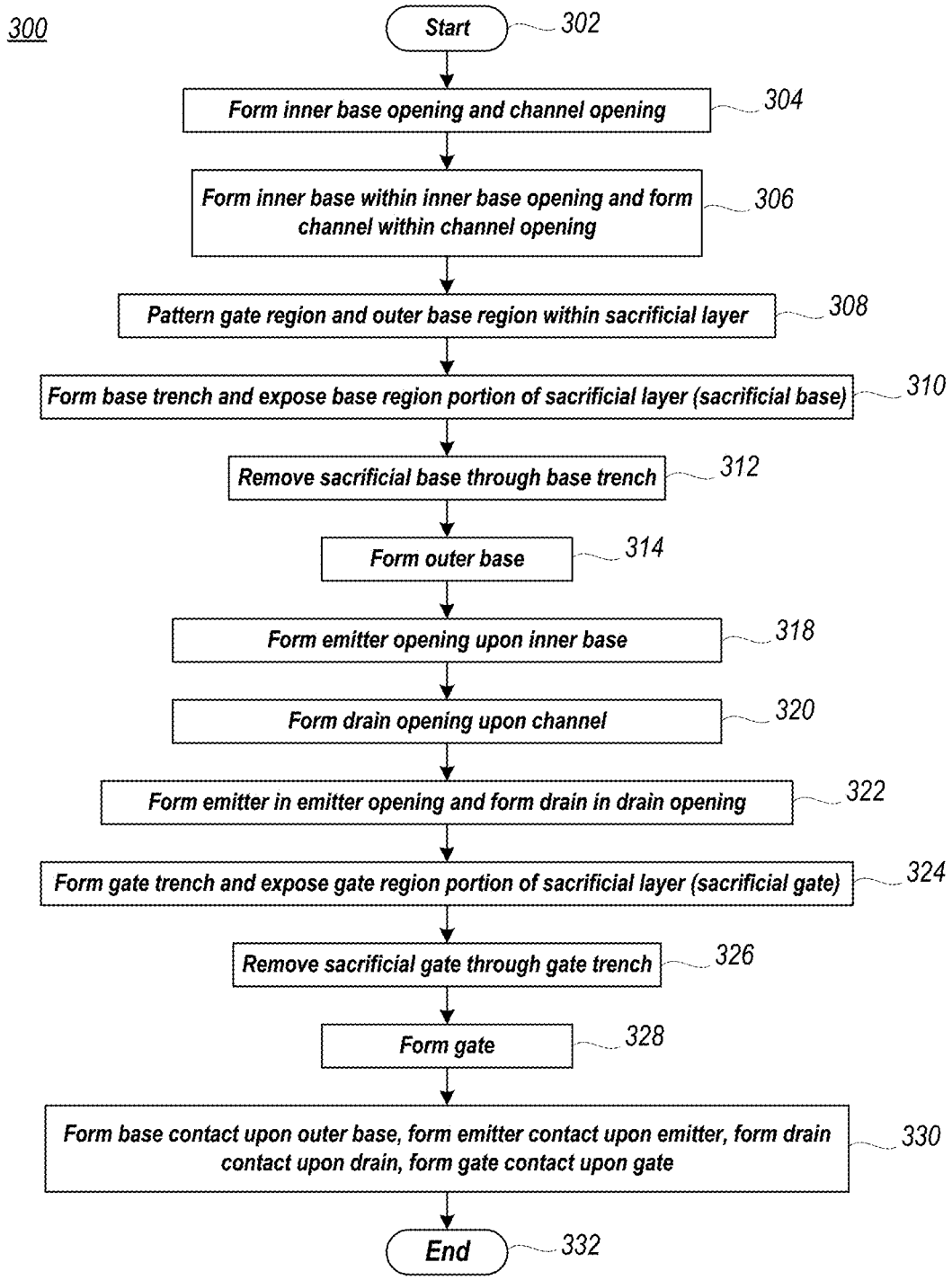
FIG. 18 is a flow diagram illustrating a semiconductor device fabrication method, in accordance with one or more embodiments.

FIG. 18 is a flow diagram illustrating a semiconductor device 100 fabrication method 300, in accordance with one or more embodiments. Method 300 begins at block 202 and may continue with forming inner base opening 206 and with forming channel opening 208. The inner base opening 206 may expose a portion of collector region 103 there below. The channel opening 208 may expose a portion of source region 123 there below.

Method 300 may continue with forming inner base 212 within inner base opening 206 and with forming channel 214 within channel opening 208 (block 306). The inner base 212 may be further formed upon the exposed portion of collector region 103. The channel 214 may be further formed upon the exposed portion of source region 123.

Method 300 may continue with patterning a sacrificial layer to define a portion of the outer base region within the sacrificial layer and a portion of the gate region within the sacrificial layer (block 308). For example, BJT/FET opening 222 is formed within sacrificial layer 202. A retained portion of sacrificial layer 202 may at least partially define the outer base region 122 and another retained portion of sacrificial layer 202 may at least partially define the gate region 120. The portion of sacrificial layer 202 that defines the outer base region 122 may be referred herein as a sacrificial base and the portion of sacrificial layer 202 that defines the gate region 120 may be referred herein as a sacrificial gate.

Method 300 may continue with forming base trench 230 that exposes at least the sacrificial base (block 310) and removing the sacrificial base through the base trench 230 (block 312). Removal of the sacrificial base generally and/or laterally enlarges base trench 230. The enlarged base trench 230 may expose portion(s) of sidewall(s) of inner base 212.

Method 300 may continue with forming outer base region 122 within the enlarged base trench 230 and upon and around the exposed expose portion(s) of sidewall(s) of inner base 212 (block 314).

Method 300 may continue with forming emitter opening 242 that exposes at least a portion of inner base 212 (block 318) and may continue with forming a drain opening 244 that exposes at least a portion of channel 214 (block 320). Method may continue with forming emitter 142 within the emitter opening 242 and upon the inner base 212 and with forming drain region 132 within the drain opening 244 and upon the channel 214 (block 322).

Method 300 may continue with forming gate trench 260 that exposes at least the sacrificial gate (block 324) and removing the sacrificial gate through the gate trench 260 (block 326). Removal of the sacrificial gate generally and/or laterally enlarges gate trench 260. The enlarged gate trench 260 may expose portion(s) of sidewall(s) of channel 214.

Method 300 may continue with forming gate region 120 within the enlarged base trench 262 and upon and around the exposed expose portion(s) of sidewall(s) of channel 214 (block 328).

Method 300 may continue with forming base contact 180 upon the outer base region 122, with forming emitter contact 182 upon the emitter 142, with forming drain contact 184 upon drain region 132, and with forming gate contact 186 upon gate region 120 (block 330). Method 300 may end at block 332.

The method flow diagrams depicted herein are exemplary. There can be many variations to the diagrams or operations described therein without departing from the spirit of the embodiments. For instance, the operations can be performed in a differing order, or operations can be added, deleted, or modified. All of these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

The invention claimed is:

1. A semiconductor device comprising:
   a bipolar junction transistor comprising:
      a collector region;
      an emitter region vertically above the collector region; and
      an inner base region positioned between the emitter region and the collector region, the base region controlling charge flow from the emitter region to the collector region; and
   a field effect transistor comprising:
      a source region electrically connected to the collector region such that all current passing the collector region enters the source region;

a drain region vertically above the source region;
a channel region positioned between the drain region and the source region; and
a gate region physically connected to a sidewall of the channel region.

2. The semiconductor device of claim 1, wherein the emitter region and the collector region include dopants of a first conductivity type, and the inner base region includes dopants of a second conductivity type.

3. The semiconductor device of claim 2, wherein the source region and the drain region include dopants of the first conductivity type and wherein the first conductivity type is P-type and the second conductivity type is N-type.

4. The semiconductor device of claim 1, wherein the collector region and the source region are physically in contact.

5. The semiconductor device of claim 1, wherein the collector region and the source region are within a same semiconductor substrate layer.

6. The semiconductor device of claim 1, wherein the base further comprises an outer base region comprising a substantially horizontal base portion around the inner base region and a substantially vertical base portion extending vertically from the substantially horizontal base portion.

7. The semiconductor device of claim 6, wherein the substantially horizontal base portion is coupled to a sidewall of the inner base region.

8. The semiconductor device of claim 7, wherein the gate region comprises a substantially horizontal gate portion around the channel region and a substantially vertical gate portion extending vertically from the substantially horizontal gate portion.

9. The semiconductor device of claim 8, wherein a top surface of the substantially vertical base portion is below a top surface of the substantially vertical gate portion.

10. The semiconductor device of claim 9, wherein a top surface of the emitter region and wherein a top surface of the drain region are between the top surface of the substantially vertical base portion and the top surface of the substantially vertical gate portion.

11. A four-terminal transistor device comprising:
a bipolar junction transistor comprising:
a collector region;
an emitter region vertically above the collector region and electrically connected to a first terminal; and
an inner base region positioned between the emitter region and the collector region, the base region controlling charge flow from the emitter region to the collector region, the base region electrically connected to a second terminal; and
a field effect transistor comprising:
a source region electrically connected to the collector region such that all current passing the collector region enters the source region;
a drain region vertically above the source region and electrically connected to a third terminal;
a channel region positioned between the drain region and the source region; and
a gate region physically connected to a sidewall of the channel region and electrically connected to a fourth terminal.

12. The four-terminal transistor of claim 11, wherein the emitter region and the collector region include dopants of a first conductivity type, and the inner base region includes dopants of a second conductivity type.

13. The four-terminal transistor of claim 12, wherein the source region and the drain region include dopants of the first conductivity type and wherein the first conductivity type is P-type and the second conductivity type is N-type.

14. The four-terminal transistor of claim 11, wherein the collector region and the source region are physically in contact.

15. The four-terminal transistor of claim 11, wherein the collector region and the source region are within a same semiconductor substrate layer.

16. The four-terminal transistor of claim 11, wherein the base further comprises an outer base region comprising a substantially horizontal base portion around the inner base region and a substantially vertical base portion extending vertically from the substantially horizontal base portion.

17. The four-terminal transistor of claim 16, wherein the substantially horizontal base portion is physically connected to a sidewall of the inner base region.

18. The four-terminal transistor of claim 17, wherein the gate region comprises a substantially horizontal gate portion around the channel region and a substantially vertical gate portion extending vertically from the substantially horizontal gate portion.

19. The four-terminal transistor of claim 18, wherein a top surface of the substantially vertical base portion is below a top surface of the substantially vertical gate portion.

* * * * *